(12) United States Patent
Miyazaki

(10) Patent No.: US 9,203,444 B2
(45) Date of Patent: Dec. 1, 2015

(54) RATE ADJUSTMENT APPARATUS AND A RATE ADJUSTMENT METHOD

(75) Inventor: Shunji Miyazaki, Kawasaki (JP)

(73) Assignee: FUJITSI LIMITED, Kawasaki (JP)

( * ) Notice: Subject to any disclaimer, the term of this patent is extended or adjusted under 35 U.S.C. 154(b) by 935 days.

(21) Appl. No.: 13/252,200

(22) Filed: Oct. 4, 2011

(65) Prior Publication Data

US 2012/0089891 A1 Apr. 12, 2012

(30) Foreign Application Priority Data

Oct. 7, 2010 (JP) .................................. 2010-227290

(51) Int. Cl.
*H03M 13/00* (2006.01)
*H04L 1/00* (2006.01)
*H03M 13/29* (2006.01)

(52) U.S. Cl.
CPC ...... *H03M 13/6558* (2013.01); *H03M 13/6356* (2013.01); *H03M 13/6362* (2013.01); *H03M 13/653* (2013.01); *H04L 1/0068* (2013.01); *H03M 13/2957* (2013.01)

(58) Field of Classification Search
None
See application file for complete search history.

(56) References Cited

U.S. PATENT DOCUMENTS

| | | | |
|---|---|---|---|
| 6,111,912 A * | 8/2000 | Cohen et al. .................. | 375/225 |
| 6,819,718 B1 | 11/2004 | Koehn et al. | |
| 6,996,114 B2 | 2/2006 | Sébire | |
| 7,076,726 B1 * | 7/2006 | Yun et al. .............. | H04L 1/0069 714/790 |
| 8,009,550 B2 * | 8/2011 | Dottling et al. ............... | 370/208 |
| 8,171,383 B2 * | 5/2012 | Landau et al. .... | H03M 13/2957 714/781 |
| RE43,622 E * | 8/2012 | Yun et al. ...................... | 714/790 |
| 8,527,842 B2 * | 9/2013 | Seyama ........................ | 714/774 |

FOREIGN PATENT DOCUMENTS

| | | |
|---|---|---|
| JP | 2002-199048 A | 7/2002 |
| JP | 2002-527937 A | 8/2002 |
| JP | 2006-504315 A | 2/2006 |

OTHER PUBLICATIONS

3GPP, et al.,"3GPP TS 25.212 V8.0.0", 3rd Generation Partnership Project; Technical Specification Group Radio Access Network; Multiplexing and channel coding (FDD) (Release 8), Nov. 1, 2007.

* cited by examiner

*Primary Examiner* — Justin R Knapp
(74) *Attorney, Agent, or Firm* — Myers Wolin, LLC

(57) ABSTRACT

A rate adjustment apparatus includes a calculating section to calculate a number of outputs where bits of input data are sequentially output when a number of times of puncturing of the input data to be punctured is smaller than a number of remaining bits after puncturing, and a processing section to sequentially output bits of the input data and puncture the bits of the input data based on the number of outputs calculated by the calculating section.

19 Claims, 35 Drawing Sheets

FIG. 5

$e = e_{ini}, \ m = 0, \ n = 0$ while $m < X_i$ ⎬ 33a $e = e - e_-$ if $e \leq 0$ then

PUNCTURE BIT $e = e + e_+$ else $y_n = x_m$ $n = n + 1$ end if $m = m + 1$ end while ⎬ 33b

FIG. 11

$$e = e_{ini} \quad m = 0$$
$$\text{while } m < X_i \qquad \qquad \}\ 38a$$
$$\quad e = e - e_-$$
$$\quad \text{if } e \leq 0$$
$$\quad\quad \text{while } e \leq 0 \quad \text{(REPEAT BIT)}$$
$$\quad\quad\quad y_n = x_m, \quad e = e + e_+ \qquad \}\ 38b$$
$$\quad\quad\quad n = n + 1$$
$$\quad\quad \text{end while}$$
$$\quad \text{else}$$
$$\quad\quad y_n = x_m$$
$$\quad\quad m = m + 1 \qquad \qquad \}\ 38c$$
$$\quad\quad n = n + 1$$
$$\quad \text{end if}$$
$$\text{end while}$$

FIG. 18

1) PARAMETER PREPARATION

$$ek0 = \left\lceil \frac{e_-}{e_+} \right\rceil \quad \} \ 44a$$

$$er0 = e_- \cdot ek0 - e_- \quad \} \ 44b$$

2) PROCESS

$e = e_{in}, \ m = 0, \ n = 0, \ k0 = 0, \ r = 0$ while $m < X_i$ $\quad \} \ 44c$ $\quad e = e + er0$
$\quad k0 = k0 + ek0$
$\quad$ if $e > e_+$ then
$\quad\quad e = e - e_+$
$\quad\quad k0 = k0 - 1$
$\quad$ end if $\quad\quad\quad \} \ 44d$ $\quad$ while $r < k0$
$\quad\quad y_n = x_m$
$\quad\quad r = r + 1$
$\quad\quad n = n + 1$ $\quad \} \ 44e$
$\quad$ end while
$m = m + 1$
$r = 0$
end while

FIG. 24

1) PARAMETER PREPARATION
  1-1) PARAMETER VARIABLE CONVERSION
      $F_+ = e_-$
      $F_- = e_+$
      $F_{int} = -e_{int} + e_+$    } 64a 1-2) REPETITION PARAMETER
      $Fk0 = \left\lceil \dfrac{F_-}{F_+} \right\rceil$ $Fr0 = F_+ \cdot Fk0 - F_-$    } 64b 1-3) INITIAL VALUE OFFSET
      $k0i = \lfloor (-e_{int} + e_+)/F_+ \rfloor$    } 64c 2) PROCESS
    $F = F_{int} - k0i \cdot F_+, \; m = -1, \; n = -1, \; k0 = -k0i \; r = 0$   } 64d while $m < X_i$
      $F = F + Fr0$
      $k0 = k0 + Fk0$
      if $F \geq F_+$ then
        $F = F - F_+$
        $k0 = k0 - 1$
      end if
      while $r < k0$
        $y_n = x_m$
        $r = r + 1$
        $n = n + 1$
      end while
      $m = m + 1$
      $r = 0$
    end while   } 64e

FIG. 30

1) PARAMETER PREPARATION
 1-1) FIRST PARAMETER VARIABLE CONVERSION: REPLACEMENT OF PARITY AND REMAINING BIT POSITION

$$f_+ = e_+$$
$$f_- = e_+ - e_-$$
$$Ep0 = e_+ - e_{ini}$$
$$kp0 = \lfloor Ep0 / f_- \rfloor$$
$$f_{ini} = (kp0 + 1) \cdot f_-$$

⎱ 84a

1-2) SECOND PARAMETER VARIABLE CONVERSION: REPETITION PARAMETER CONVERSION

$$F_+ = f_-$$
$$F_- = f_+$$
$$F_{ini} = -f_{ini} + f_+$$

1-3) REPETITION PARAMETER

$$Fk0 = \left\lfloor \frac{F_-}{F_+} \right\rfloor$$

$$Fr0 = F_+ \cdot Fk0 - F_-$$

2) PROCESS

$$k0i = \lfloor (-f_{ini} + f_+) / F_+ \rfloor$$

$$F = F_{ini} - k0i \cdot F_+, \quad m = -1, \quad n = -1, \quad k0 = -k0i, \quad r = 0$$

while $m < X_i$ $F = F + Fr0$
  $k0 = k0 + Fk0$ if $F \geq F_+$ then $F = F - F_+$
   $k0 = k0 - 1$
  end if while $r < k0$ $y_n = x_m$
   $r = r + 1$
   $n = n - 1$
  end while $m = m + 1$
  $r = 0$
end while ⎱ 85b

FIG. 35

1) PARAMETER PREPARATION
1-1) FIRST PARAMETER VARIABLE CONVERSION: REPLACEMENT OF PARITY AND REMAINING BIT POSITION $$F_+ = e_-$$
$$F_- = e_+$$
$$F_{ini} = -e_{ini} + e_+$$

1-2) REPETITION PARAMETER CONVERSION $$Fk0 = \left\lfloor \frac{F_-}{F_+} \right\rfloor$$

$$Fr0 = F_+ \cdot Fk0 - F_-$$

1-3) INITIAL VALUE OFFSET $$k0i = \lfloor (-e_{ini} + e_+)/F_+ \rfloor$$

2) PROCESS $$F = F_{ini} - k0i \cdot F_+,\ m = -1,\ n = -1,\ k0 = -k0i\ r = 0$$

while $m < X_i$
   $F = F + Fr0$
   $k0 = k0 + Fk0$
   if $F \geq F_+$ then
      $F = F - F_+$
      $k0 = k0 - 1$
   end if
   while $r < k0$
      $y_n = x_m$
      $r = r + 1$
      $n = n + 1$
   end while
   $m = m + 1$
   $r = 0$
end while

} 104

US 9,203,444 B2

RATE ADJUSTMENT APPARATUS AND A RATE ADJUSTMENT METHOD

CROSS-REFERENCE TO RELATED APPLICATION

This application is based upon and claims the benefit of priority of the prior Japanese Patent Application No. 2010-227290, filed on Oct. 7, 2010, the entire contents of which are incorporated herein by reference.

FIELD

Embodiments described herein relate to a rate adjustment apparatus that performs puncturing of input data, a rate adjustment apparatus that performs repetition of input data, a rate adjustment method that performs puncturing of input data, and a rate adjustment method that performs repetition of input data.

BACKGROUND

Wireless communication apparatuses, such as, cell phones, often adjust the rate of data to be transmitted according to transmission environment or the like. For example, in communication technologies of the Wideband Code Division Multiple Access (WCDMA) and the High Speed Packet Access (HSPA), which are standardized by the 3rd Generation Partnership Project (3GPP), when transmitting encoded data, a radio communication apparatus applies a rate matching process to the bit sequence obtained after error correction encoding.

For error correction, for example, HSPA uses a turbo code with a coding rate of $1/3$ to generate 2-bit parity bits per bit information. Then, in the rate matching process, a transmitter performs thinning-out of bits (puncturing) from an error correction encoded bit sequence or performs repeating of bits (repetition), depending on the quality of a transmission path. In addition, a receiver performs error correction decoding on a bit sequence after the rate matching process.

SUMMARY

According to an aspect of the embodiments discussed herein, a rate adjustment apparatus includes a calculating section to calculate a number of outputs where bits of input data are sequentially output when a number of times of puncturing of the input data to be punctured is smaller than a number of remaining bits after puncturing and a processing section to sequentially output bits of the input data and puncture the bits of the input data based on the number of outputs calculated by the calculating section.

Additional objects and advantages of the embodiments will be set forth in part in the description which follows, and in part will be obvious from the description, or may be learned by practice of the embodiments. The object and advantages of the embodiments will be realized and attained by means of the elements and combinations particularly pointed out in the appended claims.

It is to be understood that both the foregoing summary description and the following detailed description are exemplary and explanatory and are not restrictive of the embodiments, as claimed.

BRIEF DESCRIPTION OF DRAWINGS

FIG. 5 is a diagram illustrating an exemplary algorithm of a puncturing process of 3GPP;

FIG. 11 is a diagram illustrating an exemplary algorithm of a repetition process of 3GPP;

FIG. 18 is a diagram illustrating an algorithm of a repetition-pattern process when the number of times of repetition is calculated;

FIG. 24 is a diagram illustrating an algorithm of a puncturing process;

FIG. 30 is a diagram illustrating an algorithm of a puncturing process;

FIG. 35 is a diagram illustrating an exemplary algorithm of a repetition process.

DESCRIPTION OF EMBODIMENTS

Hereafter, embodiments will be described in detail with reference to the attached drawings.

While inventing the embodiments, observations were made regarding a related art. Such observations include the following.

In the rate matching process standardized by 3GPP, puncturing or repetition is to be performed by an algorithm using a parameter e used for judgment. For example, for puncturing, a predetermined decrement value $e_-$ is sequentially subtracted from a judgment value e, and if the judgment value e becomes negative upon performing subtraction of the decrement value $e_-$ m times (m is an integer larger than or equal to 1), the m-th bit is punctured, and an increment value $e_+$ is added. For repetition, after subtracting a predetermined decrement value $e_-$ from a judgment value e corresponding to a given bit, when the judgment value e becomes negative, a predetermined increment value $e_+$ is sequentially added to the judgment value e, and until the judgment value e becomes positive, the same bit is repeated every time the increment value $e_+$ is added.

In the aforementioned algorithm, judgment values are repeatedly calculated based on a decrement value and increment value to specify puncturing bit positions and repetition bit positions. Thus, the amount of processing is large.

First Embodiment

Figure 1A:
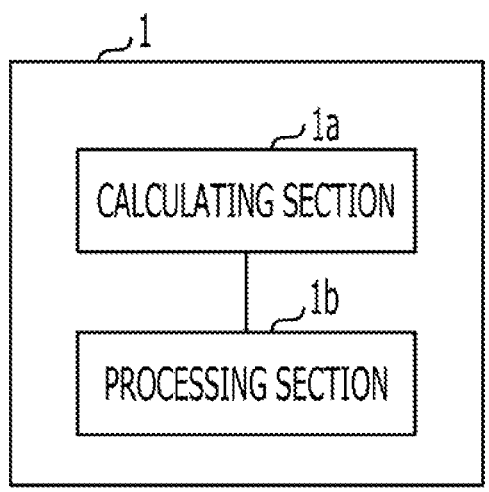
FIGS. 1A and 1B are diagrams each illustrating an exemplary configuration of a rate processing apparatus according to a first embodiment.
Figure 1B:
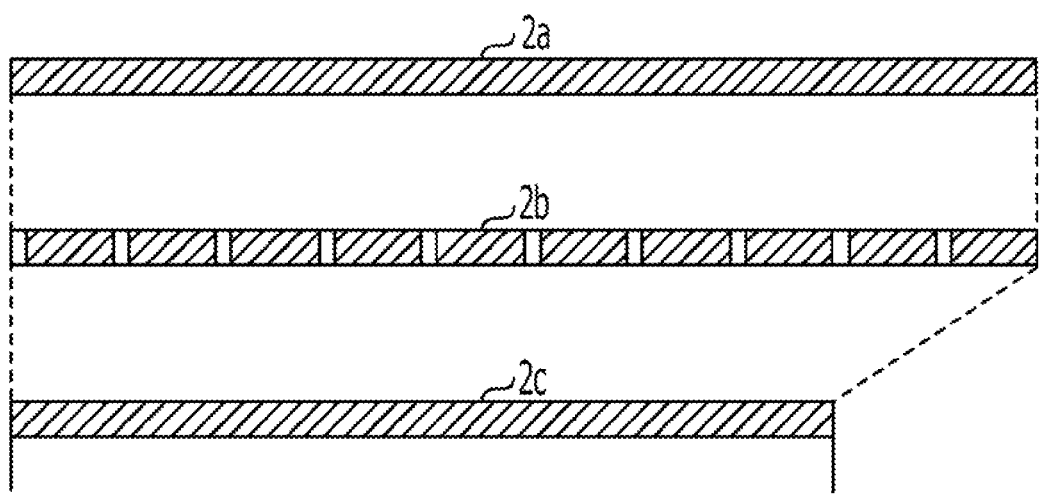

FIGS. 1A and 1B are diagrams each illustrating an exemplary configuration of a rate processing apparatus according to a first embodiment. FIG. 1 illustrates a block that represents a rate processing apparatus 1. The rate processing apparatus 1 includes a calculating section 1a and a processing section 1b.

FIG. 1B illustrates input data 2a to be punctured, data 2b that represents puncturing portions of the input data 2a, and punctured output data 2c.

The calculation section 1a calculates the number of outputs where bits of input data are sequentially output when the number of times of puncturing of the input data is smaller than the number of remaining bits after puncturing.

For example, FIG. 1B illustrates the case where the number of times of puncturing of the input data 2a is smaller than the number of remaining bits after puncturing (the number of bits of the output data 2c). Shadow areas (i.e., areas containing diagonal lines) of the data 2b in FIG. 1B represent directly output bit portions of the input data 2a, while blank areas (i.e., areas without diagonal lines) of the data 2b represent puncturing bit portions of the input data 2a. In this case, for example, the calculating section 1a calculates the number of bits of the shadow portions separated by the blanked portions of the data 2b.

The processing section 1b sequentially outputs bits of input data and punctures these bits based on the number of outputs calculated by the calculating section 1a.

As represented in the data 2b, for example, the processing section 1b punctures bits of the input data 2a. That is, the processing section 1b sequentially outputs portions of the input data 2a, which correspond to the shadow portions represented in the data 2b, from the left side of FIG. 1B.

Thus, the calculating section 1a calculates the number of outputs where bits of the input data are sequentially output when the number of remaining data after puncturing is smaller than the number of times of puncturing of the input data. Then, the processing section 1b performs a puncturing process of input data based on the calculated number of outputs. Therefore, for example, the rate processing apparatus 1 does not need to determine whether the input data is punctured every one bit, so that the amount of processing in the puncturing process can be reduced.

Second Embodiment

Next, a second embodiment will be described with reference to the attached drawings.

Figure 2:
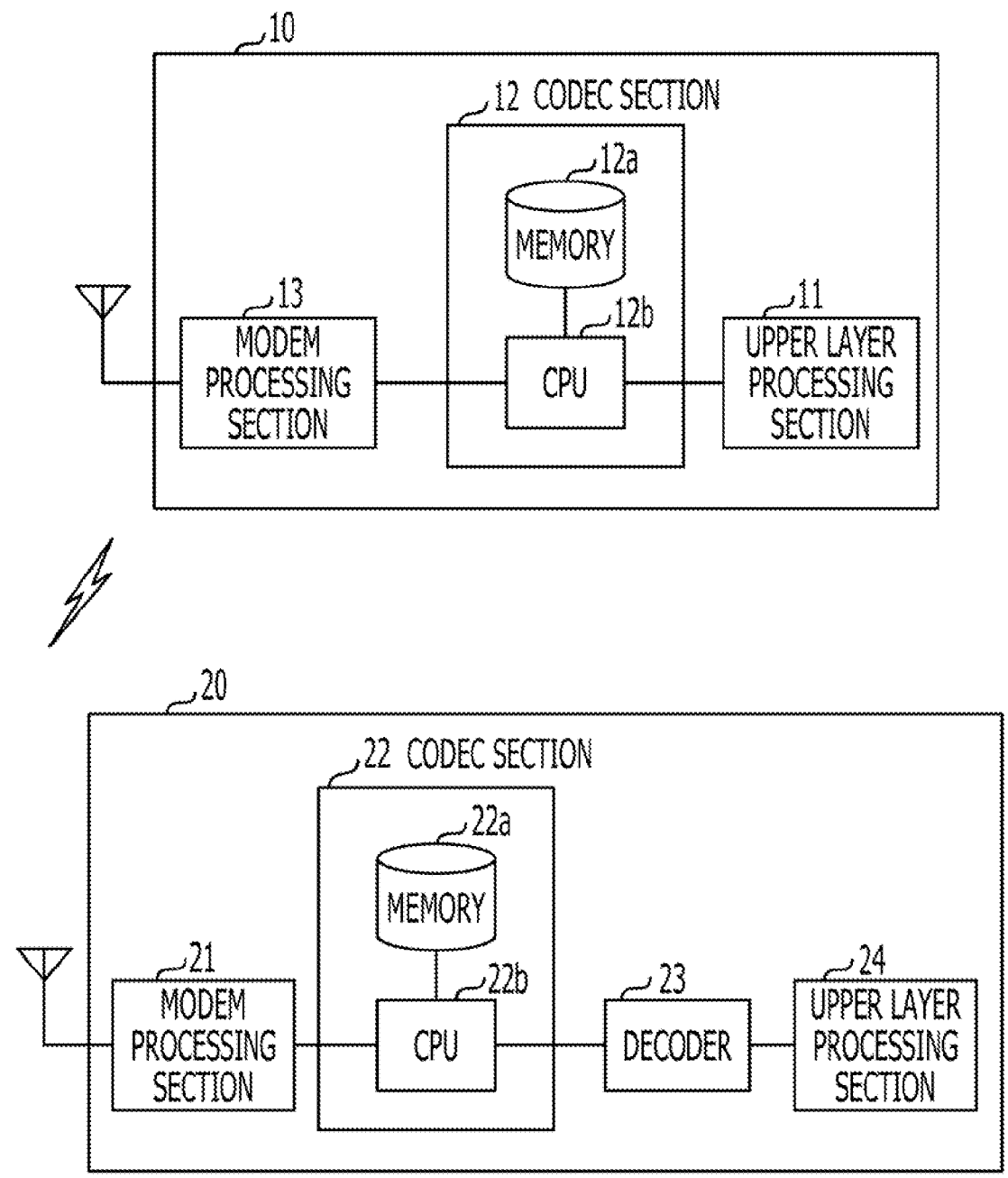
FIG. 2 is a diagram illustrating an exemplary configuration of a communication system where a rate processing apparatus according to a second embodiment is applied.

FIG. 2 is a diagram illustrating an exemplary configuration of a communication system where a rate processing apparatus according to the second embodiment is applied. FIG. 2 illustrates a transmitter 10 and a receiver 20. The transmitter 10 and the receiver 20 may be, for example, a base station and a cell phone of a cell phone system.

The transmitter 10 includes an upper layer processing section 11, a codec section 12, and a modem processing section 13.

The upper layer processing section 11 outputs data to be transmitted to the receiver 20. For example, the date may include audio data and image data.

The codec section 12 performs an encoding process of data output from the upper layer processing section 11. For example, the codec section 12 performs an error detection encoding process, an error correction encoding process, a rate matching process, an interleave process, etc. on data output from the upper layer processing section 11.

The codec section 12 includes a memory 12a and a central processing unit (CPU) 12b. The memory 12a stores an encoding program to be executed by the CPU 12b. The codec section 12 corresponds to, for example, the rate processing apparatus illustrated in FIG. 1.

The modem processing section 13 modulates data encoded by codec section 12. The modified data is wirelessly transmitted to the receiver 20 through an antenna.

The receiving device 20 includes a modem processing section 21, a codec section 22, a decoder 23, and an upper layer processing section 24.

The modem processing section 21 demodulates data wirelessly transmitted from the transmitter 10.

The coding section 22 performs processing relevant to decoding of the data demodulated by the modem processing section 21. For example, the codec section 22 performs a de-rate matching process and the like on the data output from modem processing section 21.

The codec section 22 includes a memory 22a and a CPU 22b. The memory 22a stores a program of a process to be executed by the CPU 22b. The codec section 22 corresponds to, for example, the rate processing apparatus illustrated in FIG. 1.

The decoder 23 decodes data processed by the codec section 22. For example, the decoder 23 performs a channel decoding process on the data processed by codec section 22.

For example, the upper layer processing section 24 displays data decoded by the decoder 23 on a display (not illustrated) or outputs sound from a speaker.

In FIG. 2, the transmitter 10 and the receiver 20 are illustrated as individual devices. Alternatively, however, the transmitter 10 and the receiver 20 may be integrated in one device.

Next, before describing functions of the codec sections 12 and 22, a puncturing process and a repetition process of the 3GPP will be described first using FIGS. 3 to 14.

Figure 3:
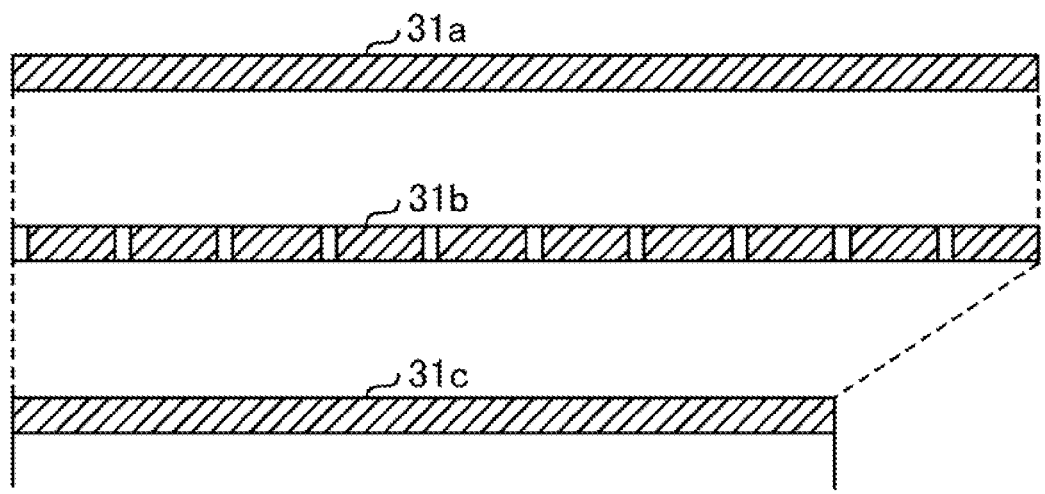
FIG. 3 is a diagram illustrating puncturing of 3GPP.

FIG. 3 is a diagram illustrating puncturing of the 3GPP. FIG. 3 illustrates encoded bits 31a, which are encoded before a rate matching process (before a puncturing process).

The puncturing process punctures only specified bits from bits $x_k$ (k=0, ..., $Y_i$-1) of the encoded bits 31a. Blank areas of encoded bits 31b illustrated in FIG. 3 represent puncturing portions of the encoded bits 31a.

The encoded bits 31c illustrate a bit sequence after puncturing of encoded bits 31a. The bit sequence of a puncturing result is set to $y_k$ (k=0, ..., $Y_i$-1). Here, $Y_k$ and $Y_i$ represent bit sizes before and after the rate matching process (before or after the repetition process).

Figure 4:
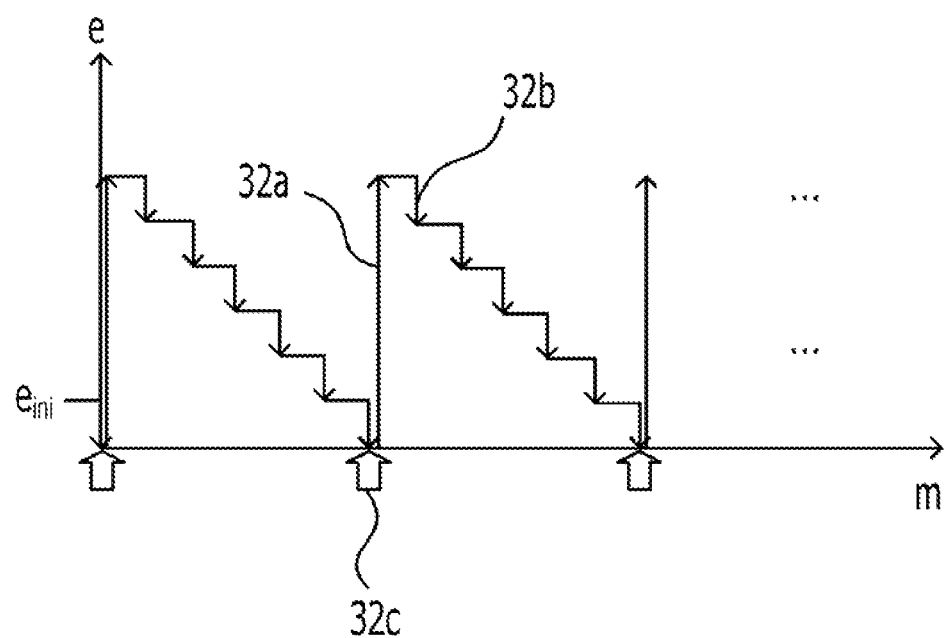
FIG. 4 is a diagram illustrating a puncturing operation of 3GPP.

FIG. 4 is a diagram illustrating a puncturing operation of the 3GPP. Puncturing bit positions and the number of times of puncturing are determined based on parameter variables: an initial value $e_{ini}$, an increment value $e_+$, and a decrement value $e_-$. An up-pointing arrow 32a illustrated in FIG. 4 represents the increment value $e_+$ and a down-pointing arrow 32b represents a decrement value.

A horizontal axis of a graph illustrated in FIG. 4 represents a bit position of input data to be punctured. For example, the horizontal axis represents the position of a bit in the encoded bits 31a illustrated in FIG. 3. A vertical axis of the graph illustrated in FIG. 3 represents the judgment value e (hereinafter, also referred to as an error variable). When the error variable e becomes 0 (zero) or less, the corresponding input bit is punctured. An arrow 32c illustrated in FIG. 4 represents a bit position of input data to be punctured.

FIG. 5 is a diagram illustrating an exemplary algorithm of a puncturing process of 3GPP. A process 33a illustrated in FIG. 5 represents that a puncturing process is repeated on all the bits of the input data.

In a process 33b, a decrement value $e_-$ is subtracted from an error variable e and judges whether the subtracted error variable e is 0 (zero) or less. In the process 33b, when the error variable e becomes 0 (zero) or less, bits of the input data are punctured. When the error is not 0 (zero) or less, the bits of the input data are directly output (without puncturing).

Figure 6:
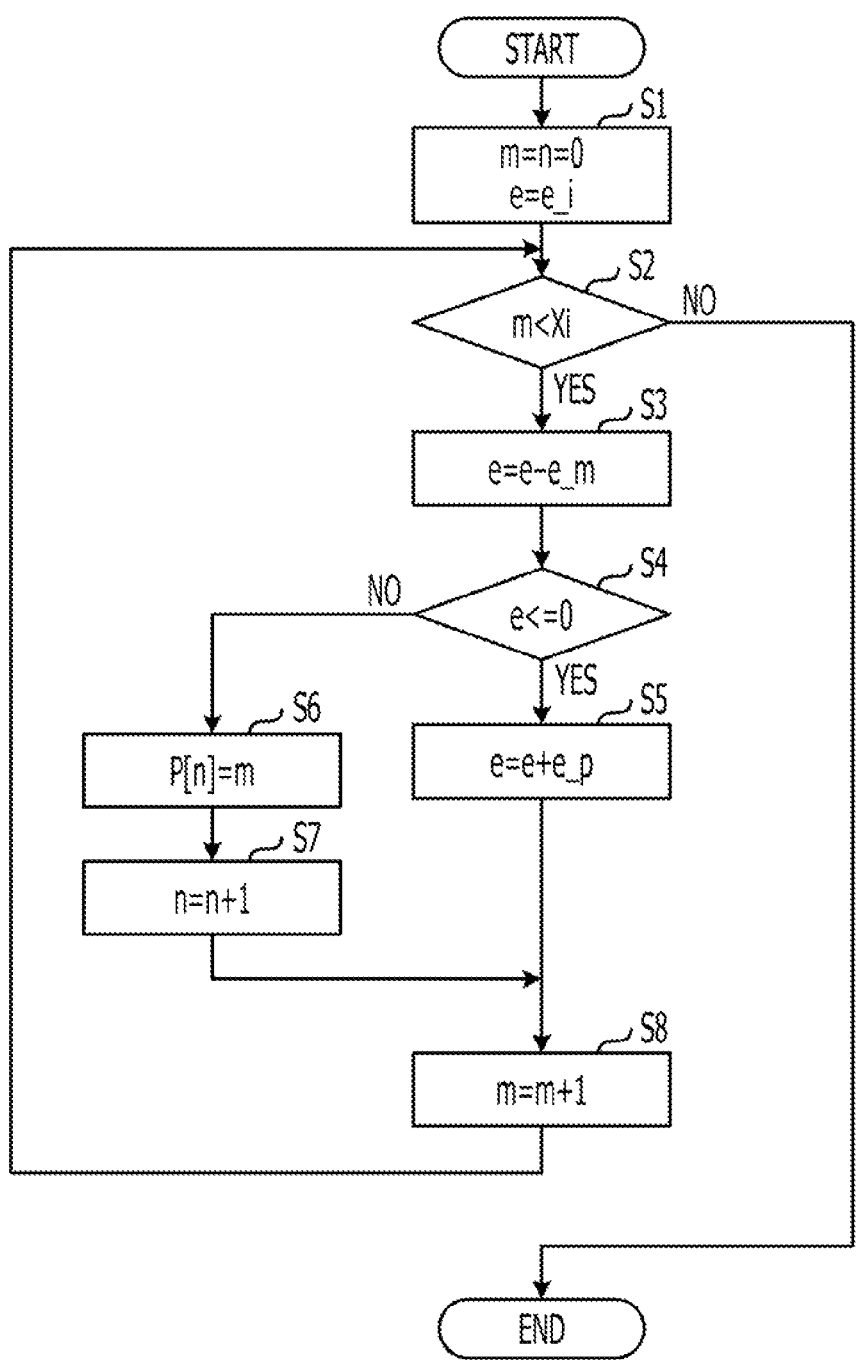
FIG. 6 is a flowchart illustrating an exemplary puncturing-pattern generation process of 3GPP.

FIG. 6 is a flowchart illustrating an exemplary puncturing-pattern generation process of the 3GPP. Although stated below, the flowchart of FIG. 6 illustrates a process for determining a relationship between an index of each puncturing bit and a bit position of input data to be punctured.

[Step S1]
A codec section initializes variables m and n to 0 (zero). The variable m is a variable corresponding to a bit position of input data and the variable n is a variable corresponding to a bit position of output data. In addition, the codec section substitutes an initial value e_i for the error variable e.

[Step S2]
The codec section determines whether the variable m is smaller than the number of bits of input data $X_i$. When the variable m is smaller than the number of bits of input data $X_i$, the codec section allows the process to proceed to step S3. The codec section ends the process when the variable m is equal to or more than the number of bits of input data $X_i$.

[Step S3]
The codec section subtracts a decrement value e_m from an error variable e.

[Step S4]
The codec section judges determines whether the error variable e is 0 (zero) or less. When the variable e is 0 (zero) or less, the codec section allows the process to proceed to step S5. When the variable e is 0 (zero) or more, the codec section allows the process to proceed to step S6.

[Step S5]
The codec section adds an increment value e_p to the error variable e.

[Step S6]
The codec section stores m in an arrangement P[n].

[Step S7]
The codec section adds 1 (one) to the variable n.

[Step S8]
A codec section adds 1 (one) to the variable m. Here, the above parameters e_i, e_p, and e_m correspond to $e_{ini}$, $e_+$, and $e_-$ illustrated in FIG. 4, respectively.

As described above, the flowchart of FIG. 6 illustrates a process for determining a relationship between an index of each puncturing bit and a bit position of input data to be punctured. For example, puncturing bits are assigned with indexes 0, 1, 2, ..., from the right side of the arrow 32c illustrated in FIG. 4. Then, the indexes of the respective puncturing bits are substituted for n of the arrangement P[n], determining bit positions of input data to be punctured.

For example, in the case of the example of FIG. 4, the bit positions of input data to be punctured are set to P[0]=0, P[1]=6, and P[2]=12, respectively. In other words, bit position of input data to be punctured may be found from the sequence P[n] obtained by the process illustrated in FIG. 6.

Next, a case where the number of times of puncturing is larger than the number of times of puncturing in FIG. 3 will be described.

Figure 7:
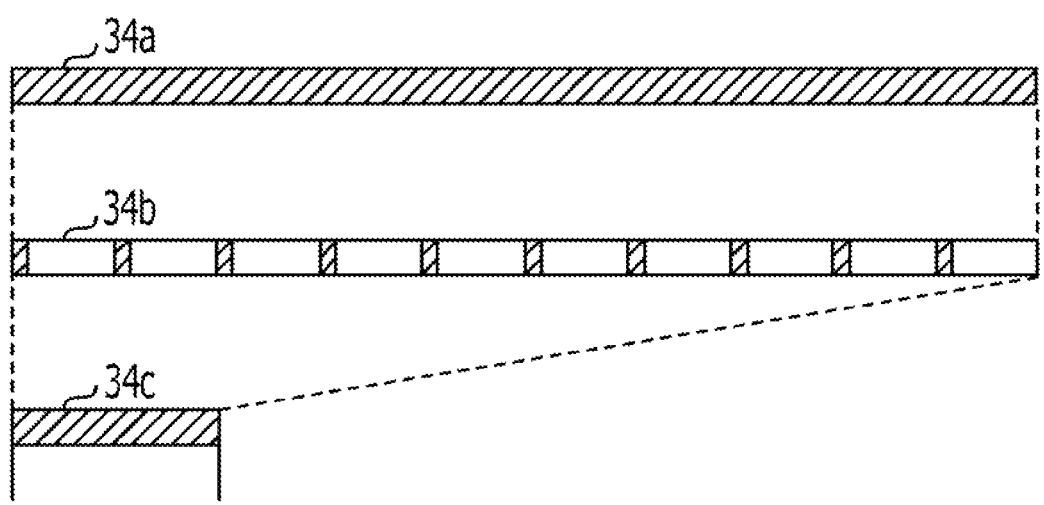
FIG. 7 is a diagram illustrating puncturing of 3GPP when the number of times of puncturing is large.

FIG. 7 is a diagram illustrating puncturing of 3GPP when the number of times of puncturing is large. FIG. 7 illustrates encoded bits 34a, which is encoded before the puncturing process.

As illustrated in FIG. 3, the puncturing process punctures only specified bits from bits in the encoded bits 34a. Blank areas of encoded bits 34b illustrated in FIG. 7 represent puncturing portions of the encoded bits 34a.

In FIG. 7, blank areas of the encoded bits 34b are larger than the blank areas of the encoded bits 31b of FIG. 3. That is, FIG. 7 illustrates a case where the number of times of puncturing is larger than the one illustrated in FIG. 3.

Figure 8:
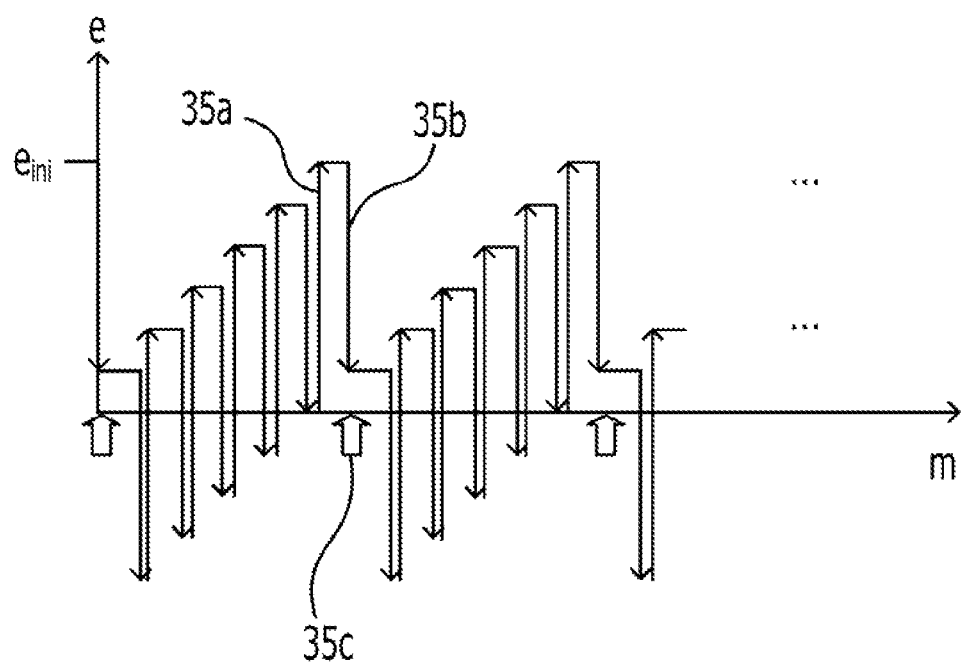
FIG. 8 is a diagram illustrating a puncturing operation of 3GPP when the number of times of puncturing is large.

FIG. 8 is a diagram illustrating a puncturing operation of 3GPP when the number of times of puncturing is large. The puncturing bit positions and the number of times of puncturing are determined based on parameter variables: an initial value $e_{ini}$, an increment value $e_+$, and a decrement value $e_-$. Therefore, for example, as illustrated in FIG. 8, the number of times of puncturing may be increased by setting the initial value $e_{ini}$, increment value $e_+$, and decrement value $e_-$. In FIG. 8, an up-pointing arrow 35a represents the increment value $e_+$ and a down-pointing arrow 35b represents a decrement value $e_-$.

A horizontal axis of a graph illustrated in FIG. 8 represents a bit position of input data to be punctured. For example, the horizontal axis represents the position of a bit in the encoded bits 34a illustrated in FIG. 7. A vertical axis illustrates the error variable e. When the error variable e becomes 0 (zero) or less, the corresponding input bit is punctured. An arrow 35c illustrated in FIG. 8 represents a remaining bit position (position of an un-punctured bit) of input data.

An algorithm when the number of times of puncturing is large is the same as one illustrated in FIG. 5. Thus, the description thereof will be omitted. A flowchart when the number of times of puncturing is large is the same as one illustrated in FIG. 6. Thus, the description thereof will be omitted.

A repetition process will be described.

Figure 9:
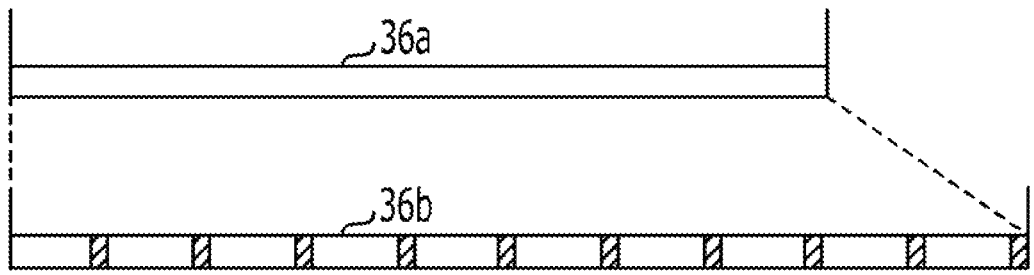
FIG. 9 is a diagram illustrating repetition of 3GPP.

FIG. 9 is a diagram illustrating repetition of 3GPP. In FIG. 9, encoded bits 36a, which are encoded before a rate matching process (before a repetition process), is illustrated.

A repetition process repeatedly outputs any bit $x_k$ (k=0, ..., $X_i$-1) of the encoded bits 36a. The shadow area of encoded bits 36b illustrated in FIG. 9 illustrates a portion where repetition (repetitive output) of encoded bits 36a is performed.

The encoded bits 36b represent a bit sequence as a result of repetition of encoded bits 36a. The bit sequence of a repetition result is set to $y_k$ (k=0, . . . , $Y_i$–1). $X_i$ and Yi are defined as bit sizes before and after the rate matching process.

Figure 10:
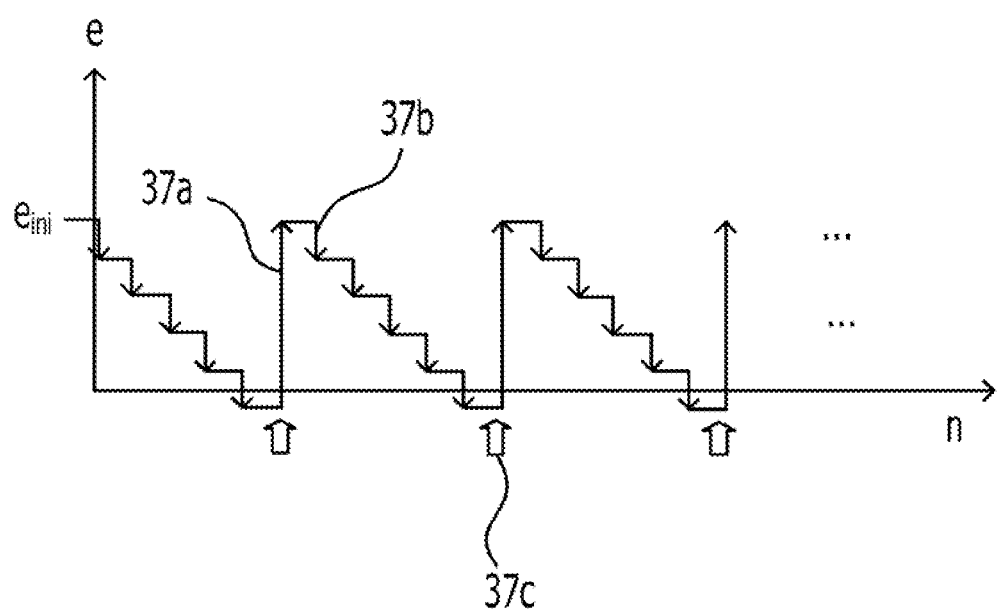
FIG. 10 is a diagram illustrating a repetition operation of 3GPP.

FIG. 10 is a diagram illustrating a repetition operation of 3GPP. Repetition positions and the number of repetition bits are determined based on parameter variables: an initial value $e_{ini}$, an increment value $e_+$, and a decrement value $e_-$. In FIG. 10, an up-pointing arrow 37a represents the increment value $e_+$ and a down-pointing arrow 37b represents a decrement value $e_-$.

A horizontal axis of a graph illustrated in FIG. 10 represents a bit position of output data after repetition. For example, the horizontal axis represents the position of a bit in the encoded bits 36b illustrated in FIG. 9. A vertical axis illustrates the error variable e. When the error variable e becomes 0 (zero) or less, the corresponding input bit is repeated. An arrow 37c illustrated in FIG. 10 represents a bit position of input data to be repeated.

FIG. 11 is a diagram illustrating an exemplary algorithm of a repetition process of 3GPP. A process 38a illustrated in FIG. 11 represents that processes after the process 38a are repeated.

The process 38b subtracts a decrement value $e_-$ from an error variable e and determines whether the subtracted error variable 3 is 0 (zero) or less. In the process 38b, when the error variable e becomes 0 (zero) or less, the same bits of the input data are repeatedly output.

The process 38c is represented as a process when the error variable e is not 0 (zero) or less and directly outputs bits of the input data.

Figure 12:
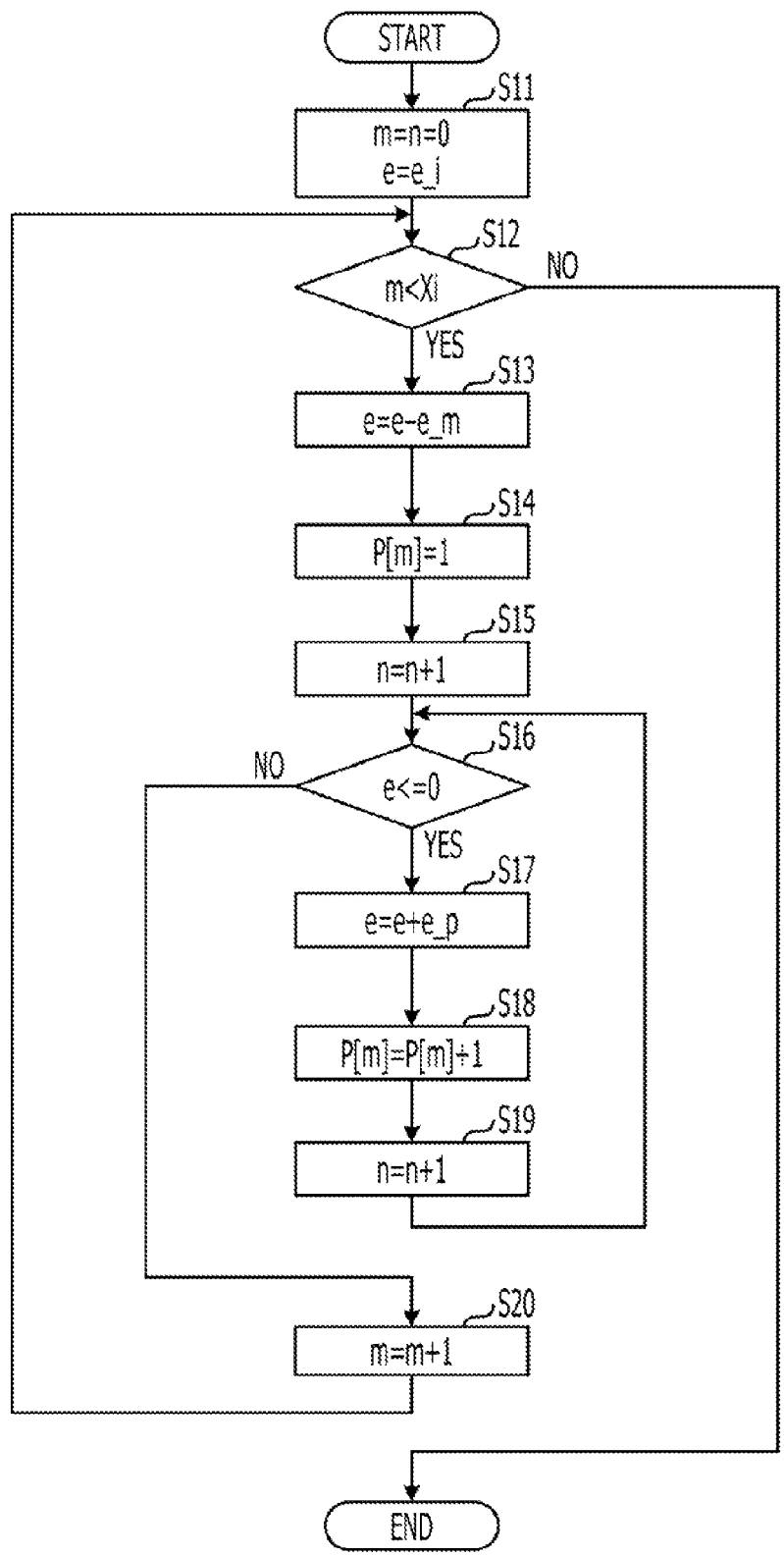
FIG. 12 is a flowchart illustrating an exemplary repetition-pattern process of 3GPP.

FIG. 12 is a flowchart illustrating an exemplary repetition-pattern process of 3GPP. As will be described below, the flow chart of FIG. 12 illustrates a process for obtaining a relationship between bit positions of input data and the number of times of repeatedly outputting bits located on the bit positions.

[Step S11]
A codec section initializes variables m and n to 0 (zero). The variable m is a variable corresponding to a bit position of input data and the variable n is a variable corresponding to a bit position of output data. In addition, the codec section substitutes an initial value e_i for the error variable e.

[Step S12]
The codec section determines whether the variable m is smaller than the number of bits of input data $X_i$. When the variable m is smaller than the number of bits of input data $X_i$, the codec section allows the process to proceed to step S13. The codec section ends the process when the variable m is equal to or more than the number of bits of output data $X_i$.

[Step S13]
The codec section subtracts a decrement value e_m from an error variable e.

[Step S14]
The codec section stores 1 in an arrangement P[m].

[Step S15]
The codec section adds 1 (one) to the variable n.

[Step S16]
The codec section judges determines whether the error variable e is 0 (zero) or less. When the variable e is 0 (zero) or less, the codec section allows the process to proceed to step S17. When the variable e is 0 (zero) or more, the codec section allows the process to proceed to step S20.

[Step S17]
The codec section adds an increment value e_p to the error variable e.

[Step S18]
The codec section adds 1 (one) to a value stored in the arrangement P [m].

[Step S19]
The codec section adds 1 (one) to the variable n. The codec section returns the process to step S16.

[Step S20]
The codec section adds 1 (one) to the variable m.

As described above, the flowchart of FIG. 12 illustrates a process for determining a relationship between a bit position of input data and the number of times of repeatedly outputting a bit at the bit position. For example, when the bit position of the input data is substituted for m of the arrangement P[m] obtained by the flowchart in FIG. 12, the number of times of repeatedly outputting a bit on the bit position.

For example, in the case of the example of FIG. 10, the bit positions of input data to be punctured are set to P[0]=0, P[1]=1, P[2]=1, P[3]=1, P[4]=2, P[5]=1, and so on, respectively. In other words, the number of times of repetition of bits of input data may be found from the arrangement P[m] calculated by the process illustrated in FIG. 10.

Next, a case where the number of times of repetition is larger than the number of times of repetition in FIG. 9 will be described.

Figure 13:
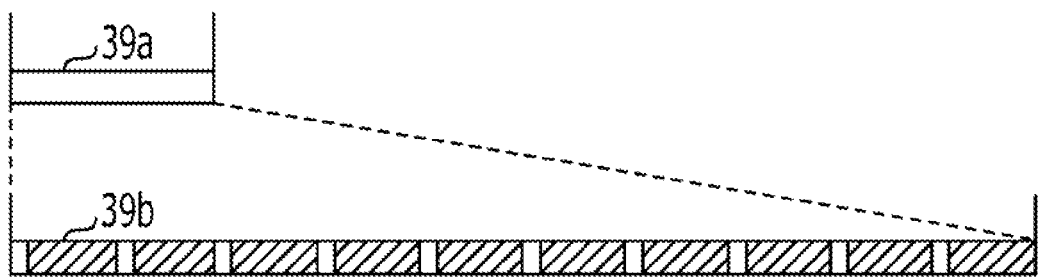
FIG. 13 is a diagram illustrating repetition of 3GPP when the number of times of repetition is large.

FIG. 13 is a diagram illustrating repetition of 3GPP when the number of times of repetition is large. In FIG. 13, the encoded bits 39a before the repetition process represents an encoding bit 39a.

A repetition process repeatedly outputs any bit of the encoded bits 39a as described in FIG. 9. The shadow area of encoded bits 39b illustrated in FIG. 13 illustrates a portion where repetition (repetitive output) of encoded bits 39a is performed.

In the FIG. 13, a shadow area of encoded bits 39b is larger than a shadow area of encoded bits 36b of FIG. 9. That is, FIG. 13 illustrates a case where the number of times of puncturing is larger than the one illustrated in FIG. 9.

Figure 14:
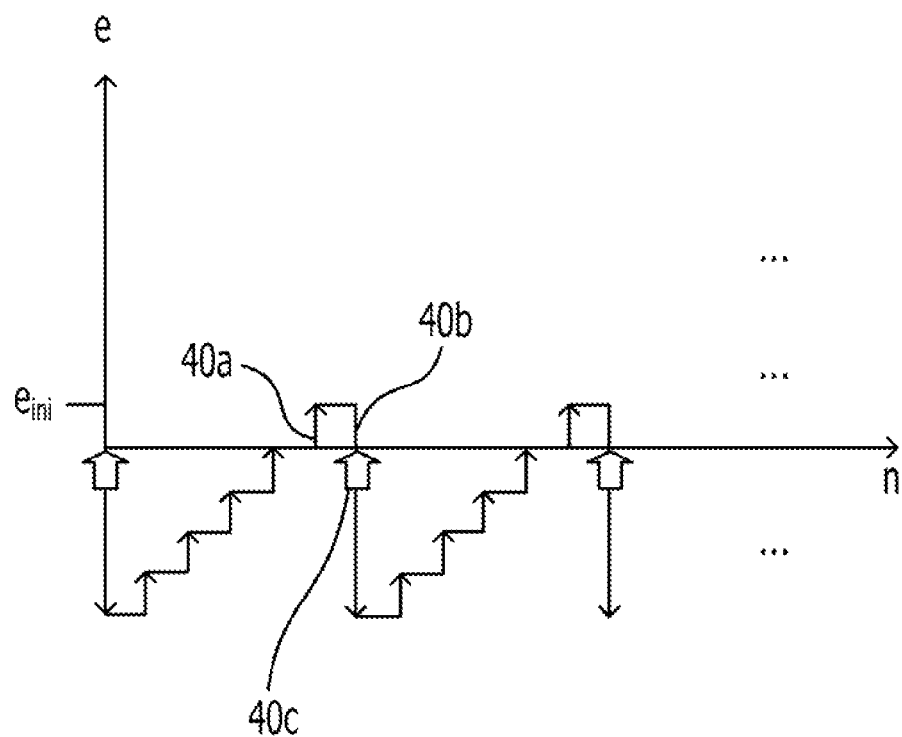
FIG. 14 is a diagram illustrating a repetition operation of 3GPP when the number of times of repetition is large.

FIG. 14 is a diagram illustrating a repetition operation of 3GPP when the number of times of repetition is large. As illustrated in FIG. 10, repetition positions and the number of repetition bits of the bit of input data are determined based on parameter variables: an initial value $e_{ini}$, an increment value $e_+$, and a decrement value $e_-$. Therefore, for example, as illustrated in FIG. 14, the number of times of puncturing may be increased by setting the initial value $e_{ini}$, increment value $e_+$, and decrement value $e_-$. In FIG. 14, an up-pointing arrow 40a represents the increment value $e_+$ and a down-pointing arrow 40b represents a decrement value $e_-$.

A horizontal axis of a graph illustrated in FIG. 14 represents a bit position of output data after repetition. For example, the horizontal axis represents the position of a bit in the encoded bits 39b illustrated in FIG. 13. A vertical axis illustrates the error variable e. During a period that the error variable e is 0 (zero) or less, the corresponding input bit is repeated. An arrow 40c illustrated in FIG. 4 represents a bit position of input data which is not repeated (number of times of repetition is 1 (one)).

An algorithm when the number of times of repetition is large is the same as one illustrated in FIG. 11. Thus, the description thereof will be omitted. A flowchart when the number of times of repetition is the same as one illustrated in FIG. 12. Thus, the description thereof will be omitted.

Here, in the repetition process, when the number of times of repetition becomes large, for example, the number of times of performing a loop processing (while processing) of the process 38b illustrated in FIG. 11 is increased. Furthermore, the number of times of performing processes of steps S17 to S19 illustrated in FIG. 12 is increased. Therefore, for example, a process burden becomes large in the repetition process of FIG. 13, with respect to a repetition process of FIG. 9. Then, by previously calculating the number of times of repetition, the repetition process burden of FIG. 13 may be reduced.

Figure 15:
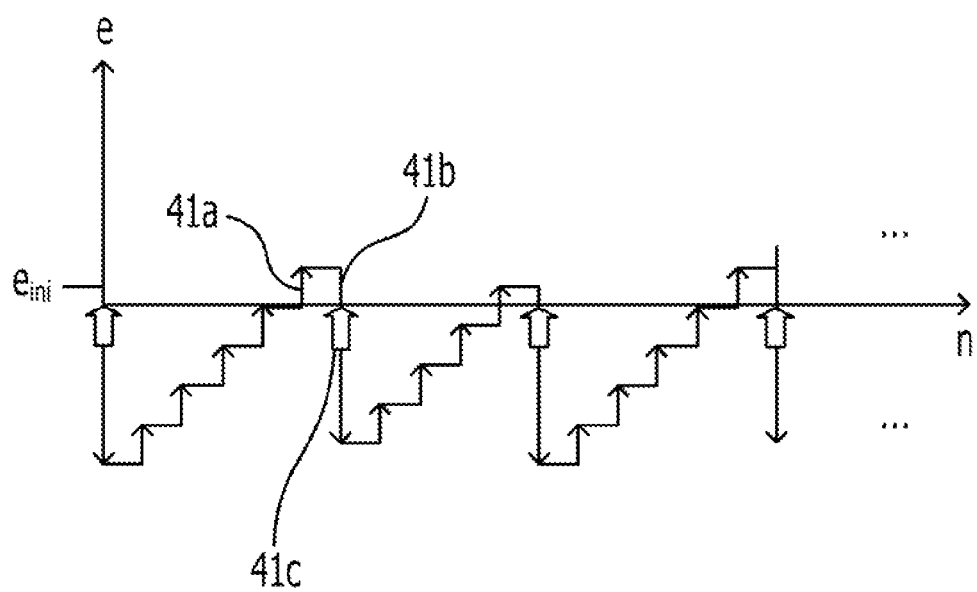
FIG. 15 is a first part of a diagram illustrating calculation of the number of times of repetition.

FIG. 15 is a first part of a diagram illustrating calculation of the number of times of repetition. As illustrated in FIG. 10, repetition positions and the number of repetition bits of the bit of input data are determined based on parameter variables: an initial value $e_{ini}$, an increment value $e_+$, and a decrement value $e_-$. Therefore, for example, as illustrated in FIG. 15, the number of times of puncturing may be increased by setting the initial value $e_{ini}$, increment value $e_+$, and decrement value $e_-$. In addition, the number of times of repetition may be changed by setting parameter variables.

For example, in an example illustrated in FIG. 15, the number of times of repetitions varies 5, 4, 5, . . . from bit to bit. A 0-th bit of input data is repeated five times and then output. A first bit thereof is repeated four times and then output. In FIG. 15, an up-pointing arrow 41a represents the increment value $e_+$ and a down-pointing arrow 41b represents a decrement value $e_-$.

A horizontal axis of a graph illustrated in FIG. 15 represents a bit position of output data after repetition. A vertical axis illustrates the error variable. During a period that the error variable is 0 (zero) or less, the corresponding input bit is repeated. An arrow 41c illustrated in FIG. 15 represents a bit position of input data which is not repeated.

Figure 16:
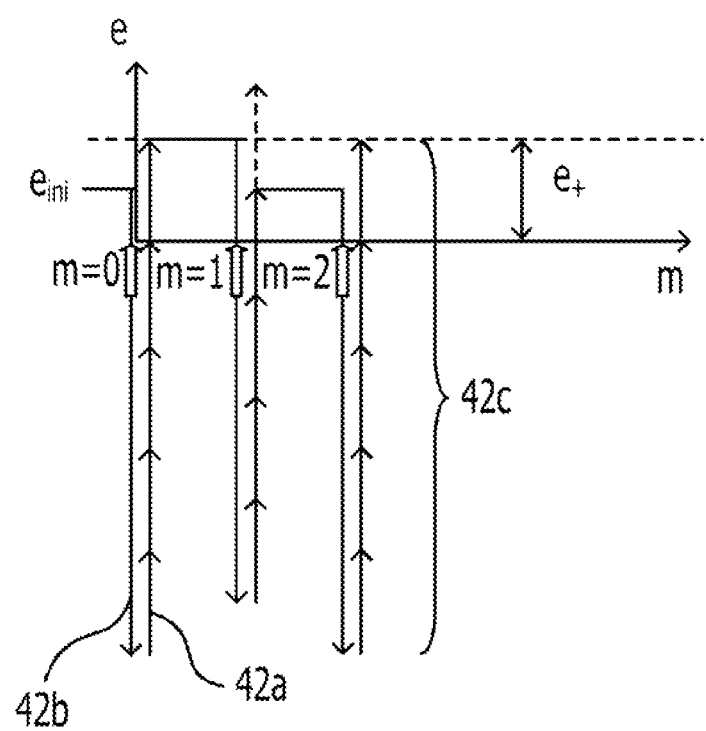
FIG. 16 is a second part of the diagram illustrating calculation of the number of times of repetition.

FIG. 16 is a second part of the diagram illustrating calculation of the number of times of repetition. The parameter variables of FIG. 16 are the same as those illustrated in FIG. 15. That is, the number of times of repetition varies 5, 4, 5, . . . in order.

A horizontal axis of a graph illustrated in FIG. 16 represents a bit position of input data to be punctured. A vertical axis illustrates the error variable. During a period that the error variable is 0 (zero) or less, the corresponding input bit is repeated. In FIG. 16, an up-pointing arrow 42a represents the increment value $e_+$ and a down-pointing arrow 42b represents a decrement value $e_-$.

The graph in FIG. 16 is in a compressed form of the horizontal axis of the graph in FIG. 15. As illustrated in FIG. 16, it is found that a 0-th bit (m=0) of input data is repeated five times and a first bit (m=1) bit of the input data is repeated four times.

That is, an increment value $e_+$ included in between an arrow head of the arrow 42b representing a decrement value $e_-$ and a lateral dashed line ($e=e_+$) illustrated in FIG. 16 is calculated. In other words, by counting the number of the arrows 42a to calculate the number of times of repetition of the input bit may be calculated. For example, it is found that the number of times of repetition 42c illustrated in FIG. 16 represents the number of times of repetition of a second bit (m=2) of the input data and the number thereof is 5.

Figure 17:
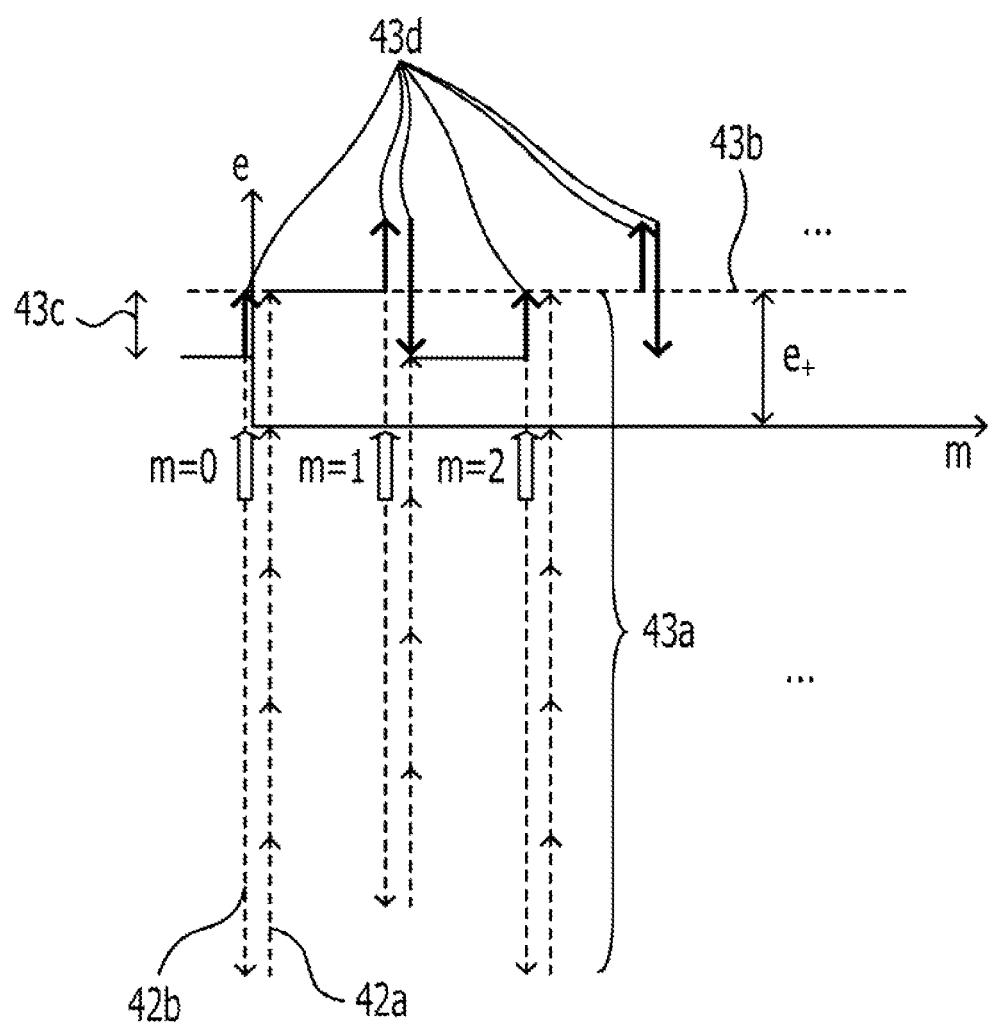
FIG. 17 is a third part of the diagram illustrating calculation of the number of times of repetition.

FIG. 17 is a third part of the diagram illustrating calculation of the number of times of repetition. The parameter variables of FIG. 17 are the same as those illustrated in FIG. 15 and FIG. 16. In FIG. 7, the same reference symbols as in FIG. 6 are used to denote the corresponding portions and the description thereof will be omitted.

To calculate the number of times of repetition of an input bit, a standard number of times of repetition 43a (number used as a standard for input-bit repetition) in FIG. 17 is calculated. The standard number of times of repetition may be calculated by the following Equation (1):

$$ek0 = \left\lceil \frac{e_-}{e_+} \right\rceil \quad (1)$$

The number of times of repetition of an input bit is provided as a standard number of times of repetition 43a. However, as represented by m=1 in FIG. 17, there is a case where the number of times of repetition is 1 smaller than the standard number of times of repetition. That is, when the error variable e exceeds a dashed line 43b, the number of times of repetition becomes 1 smaller than the standard number of times of repetition.

Then, a standard residue number is calculated. The standard residue number is provided for allowing an error variable e to be corresponded to every one of input bits and represent whether the bit is 1 smaller than the reference repetition number. The standard residue number is calculated from the following Equation (2) based on an increment value $e_+$ and a decrement value $e_-$.

$$er0 = ek0 \cdot e_+ - e_- \quad (2)$$

A standard residue number of Equation (2) represents an arrow 43c in FIG. 17. Thus, the standard residue number is sequentially added to error variables e (an initial value of the error variable is $e_{ini}$). Then, when the error variable e becomes larger than the increment value $e_+$, the increment value $e_+$ is subtracted from the error variable.

In other words, for example, the error variable e varies as represented by the arrow 43d. In other words, by introducing the standard residue number, the error variable e is allowed to be corresponded to every one of input bits and represent whether the bit is 1 smaller than the reference repetition number.

As illustrated in FIG. 17, when the error variable e with the introduced standard residue number is smaller than the dashed line 43b (increment value $e_+$), a suitable repetition result may be obtained by making the number of times of repetition of the input bit 1 less than the standard repetition.

For example, in the case of the example illustrated in FIG. 17, the standard number of times of repetition is set to 5. In the case of an input with the error variable e larger than $e_+$ (for example, m=1), the number of times of repetition is set to 4 which is obtained by reducing 1 from the standard repetition. Therefore, for example, as illustrated in FIG. 15, it is not necessary to sequentially calculate error variables e and determine whether an input bit is repeated. It is possible to determine how many times an input bit is repeated by performing an arithmetical operation once. Therefore, an amount of processing can be reduced.

FIG. 18 is a diagram illustrating an algorithm of a repetition-pattern process when the number of times of repetition is calculated. A process 44a illustrated in FIG. 18 calculates a standard number of times of repetition. A process 44b calculates the standard residue number.

A process 44c represents that a repetition process is repeated on all the bits of input data.

A process 44d represents that a standard residue number er0 is added to an error variable e and a standard number of times of repetition is added to a variable k0. Then, the process 44d represents that, when an error variable e is larger than an increment value $e_+$, the increment value $e_+$ is subtracted from the error variable e. Then, the process 44d represents that 1 is subtracted from the variable k0.

The process 44*e* represents that part of input bits corresponding to a value represented by the variable k0 is output as a repeated value. In the repetition process of FIG. 18, with respect to the repetition process illustrated in FIG. 11, the amount of processing (amount of processing included in while of the process 38*b*).

Figure 19:
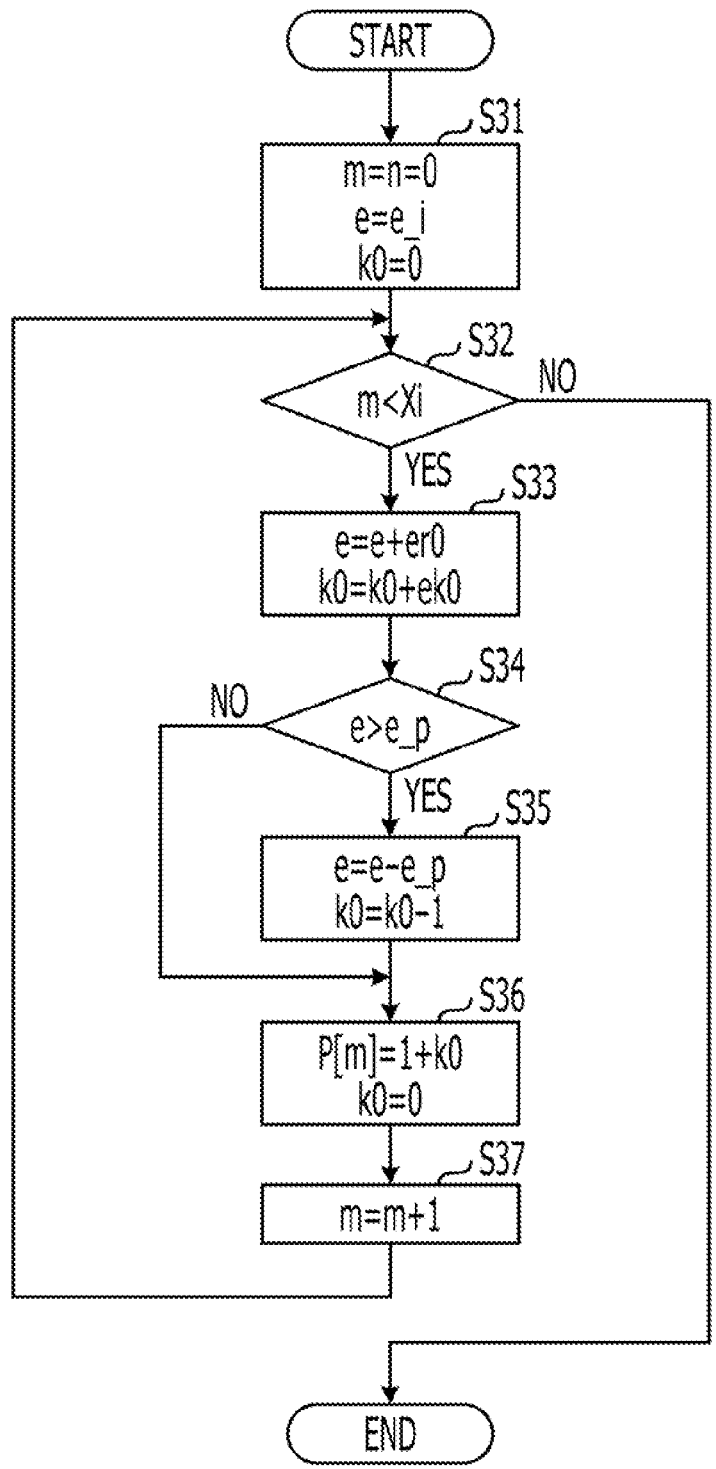
FIG. 19 is a flowchart illustrating an exemplary repetition-pattern process when the number of times of repetition is calculated.

FIG. 19 is a flowchart illustrating an exemplary repetition-pattern process when the number of times of repetition is calculated. Although, as described below, the flow chart of FIG. 12 illustrates a process for obtaining a relationship between bit positions of input data and the number of times of repeatedly outputting bits located on the bit positions.

[Step S31]

A codec section initializes variables m and n to 0 (zero). The variable m is a variable corresponding to a bit position of input data and the variable n is a variable corresponding to a bit position of output data. In addition, the codec section substitutes an initial value e_i for the error variable e. The codec section assigns 1 (one) to the variable k0.

[Step S32]

The codec section determines whether the variable m is smaller than the number of bits of input data $X_i$. When the variable m is smaller than the number of bits of input data $X_i$, the codec section allows the process to proceed to step S33. The codec section ends the process when the variable m is equal to or more than the number of bits of input data $X_i$.

[Step S33]

The codec section adds a standard residue number er0 to the error variable e. In addition, the codec section adds the standard number of times of repetition to the variable k0.

[Step S34]

The codec section determines whether the error variable e is larger than an increment value e_p. When the variable e is larger than the increment value e_p, the codec section allows the process to proceed to step S35. When the variable e is not larger than the increment value e_p, the codec section allows the process to proceed to step S36.

[Step S35]

The codec section subtracts the increment value e_p from the error variable e. In addition, the codec section subtracts 1 (one) from the variable k0.

[Step S36]

The codec section stores the variable k0 added with 1 in an arrangement P[m]. The codec section assigns 1 (one) to the variable k0.

[Step S37]

The codec section S37 adds 1 (one) to the variable m and allows the process to proceed to the step S32.

As described above, the flowchart of FIG. 19 illustrates a process for determining a relationship between an index of each puncturing bit and a bit position of input data to be punctured. For example, when the bit position of the input data is substituted for m of the arrangement P[m] obtained by the flowchart in FIG. 12, the number of times of repeatedly outputting a bit on the bit position.

For example, in the case of the example illustrated in FIG. 17, the number of times of repetition is represented by P[0]=5, P[1]=4, P[2]=5, and so on. In other words, the number of times of repetition of bits of input data may be found from the arrangement P[m] calculated by the process illustrated in FIG. 19.

In the process in FIG. 19, the number of steps to be repeated is reduced compared with steps S16 to S19 of the process in FIG. 12.

Here, the codec sections 12 and 22 in FIG. 2 are now described again. Since the codec section 22 has the same function as that of the codec section 12, the codec section 12 will be described below. In the following description, a method for calculating the number of times of repetition, which has been described in FIGS. 15 to 19, may be referred to as a repetition standard form.

Figure 20:
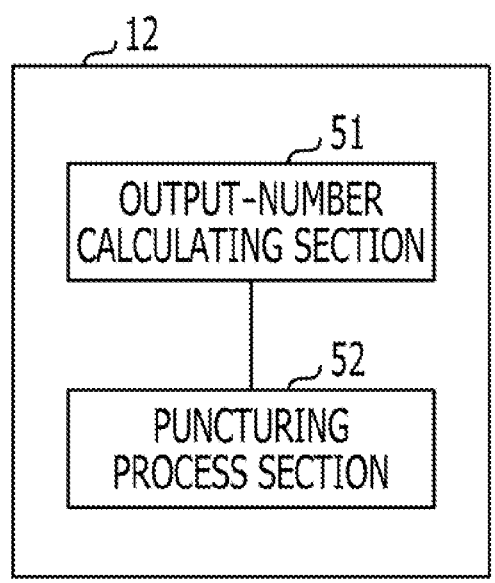
FIG. 20 is a diagram illustrating a block as a codec section.

FIG. 20 is a diagram illustrating a block as a codec section. As illustrated in FIG. 20, the codec section 12 includes an output-number calculating section 51 and a puncturing process section 52. The codec section 12 performs, for example, an encoding process of a data transmission channel of the HSPA (High Speed-physical Downlink Shared Channel; HS-DSCH). The codec section 12 is allowed to realize, for example, functions of blocks in FIG. 20 when the CPU 12*b* executes programs stored in the memory 12*a*.

The output-number calculating section 51 calculates a standard output number which outputs bits of input data continuously one by one as it is. When the number of times of puncturing of the input data is smaller than the number of remaining bits after puncturing.

The puncturing process section 52 performs, based on a calculated standard output number calculated by the output-number calculating section 51, sequential outputting input data bits and puncturing the input data bits.

Figure 21:
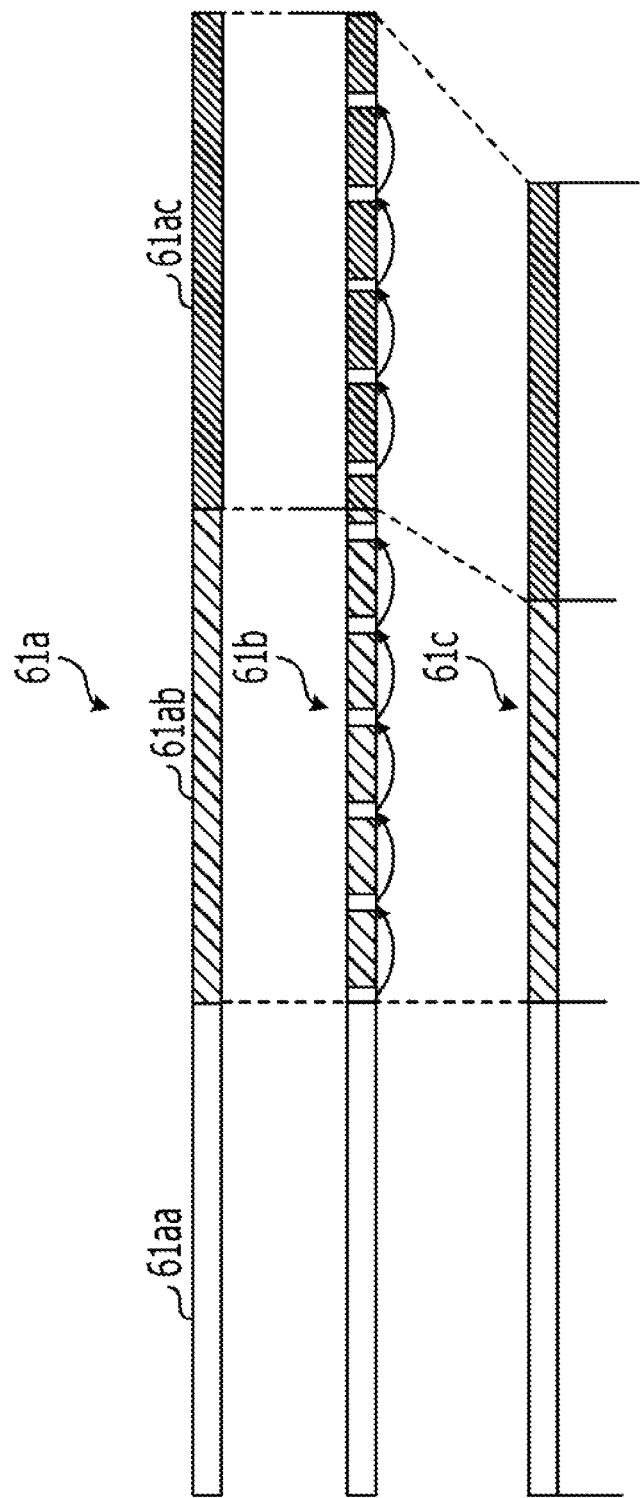
FIG. 21 is a diagram illustrating a puncturing process of the codec section.

FIG. 21 is a diagram illustrating a puncturing process of the codec section. FIG. 21 illustrates encoded bits 61*a*, which is turbo-encoded before the puncturing process. The encoded bits 61*a* include systematic bits 61*aa*, parity bits 61*ab* (parity series 1), and parity bits 61*ac* (parity series 2).

In a first rate matching of HSPA, for example, a puncturing process is applied when the number of bits after turbo encoding exceeds a hybrid automatic repeat request (H-ARQ) soft buffer size. The output bits are restricted to those of the soft buffer size.

A puncturing process is independently applied to each of parity series 1 and 2 of encoded bits 61*a*. A difference between the puncturing processes on the parity series 1 and 2 is in parameter variables. In the following description, it will be described using the parity series 1 as an example.

The puncturing process punctures specified bits from bits $x_k$ (k=0, . . . , $X_i$−1) of the parity bit 61*ab*. The blank areas in the encoded bits 61*b* illustrated in FIG. 21 represent the puncturing portion of parity bits 61*ab* and 61*ac*, respectively.

The encoded bits 61*c* illustrate a bit sequence after puncturing of encoded bits 31*a*. A bit sequence obtained as a result of puncturing the parity bits 61*ab* is set to $y_k$ (k=0, . . . , $Y_i$−1). Here, $Y_k$ and $Y_i$ are bit sizes before and after the puncturing process of the parity bits 61*ab*.

The puncturing in FIG. 21 is in a relationship of 2M<X (M: number of times of puncturing, X: number of bits in parity bits 61*ab*). In other words, the puncturing in FIG. 21 presupposes that the number of times of puncturing of input data (parity bits 61*ab*) is smaller than the number of bits remaining after the puncturing.

Figure 22:
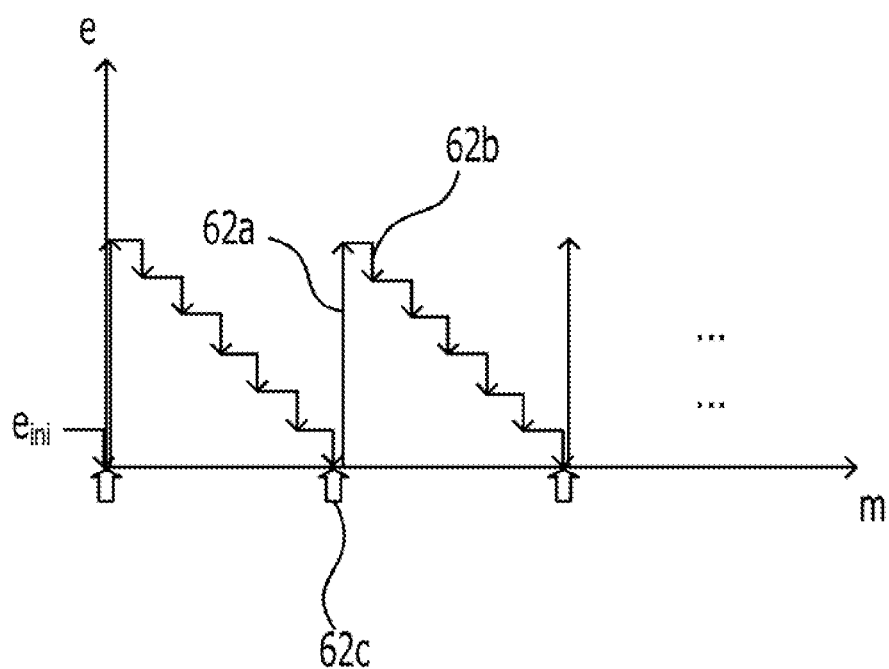
FIG. 22 is a diagram illustrating the puncturing operation illustrated in FIG. 21.

FIG. 22 is a diagram illustrating the puncturing operation illustrated in FIG. 21. Puncturing bit positions and the number of times of puncturing are determined based on parameter variables: an initial value $e_{ini}$, an increment value $e_+$, and a decrement value $e_-$. Therefore, from the initial value $e_{ini}$, the increment value $e_+$, and the decrement value $e_-$, it is possible to know whether the number of times of puncturing of the input data is smaller than the number of remaining bits after puncturing. In FIG. 22, an up-pointing arrow 62*a* represents the increment value $e_+$ and a down-pointing arrow 62*b* represents a decrement value $e_-$.

A horizontal axis of a graph illustrated in FIG. 22 represents a bit position of input data to be punctured. For example, the horizontal axis represents the position of a bit in the parity bits 61*ab* illustrated in FIG. 21. A vertical axis of the graph illustrated in FIG. 22 represents a judgment value (error variable) e. When the error variable e becomes 0 (zero) or less, the corresponding input bit is punctured. An arrow 62c illustrated in FIG. 22 represents a bit position of input data to be punctured.

When the graph in FIG. 22 is reversed with respect to the horizontal axis, it becomes the same form as the repetition standard form illustrated in FIG. 15. In other words, by converting parameter variables so that they may be reversed with respect to the horizontal axis, it is possible to reduce an amount of processing repetition like the repetition standard form.

Figure 23:
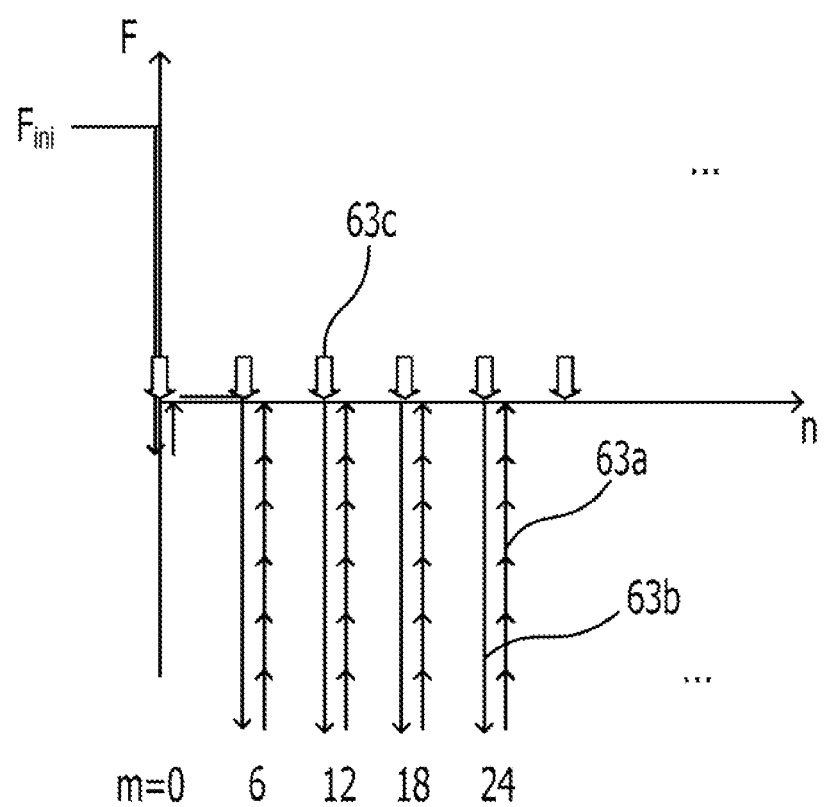
FIG. 23 is a diagram illustrating a puncturing operation where parameter-variable conversion is performed.

FIG. 23 is a diagram illustrating a puncturing operation where parameter-variable conversion is performed. A parameter-variable conversion is performed as represented by the following Equation (3) and a graph with a compressed horizontal axis is illustrated in FIG. 23.

$$F_+ = e_-$$

$$F_- = e_+$$

$$F_{ini} = -e_{ini} + e_+ \qquad (3)$$

The horizontal axis of FIG. 23 represents an index of a puncturing bit to be punctured in the parity bits 61ab and the vertical axis thereof represents an error variable F obtained by parameter-variable conversion. An arrow 63a represents an increment value $F_+$ after the parameter-variable conversion. An arrow 63b represents a decrease value F− after the parameter-variable conversion. An arrow 63c represents an index of a bit to be punctured in the parity bits 61ab.

That is, in the case of a puncturing process of 2M<X, by the parameter-variable conversion represented by Equation (3), it becomes the same repetition standard form as one illustrated in FIG. 17.

FIG. 24 is a diagram illustrating an algorithm of a puncturing process. The output-number calculating section 51 performs a process 64a illustrated in FIG. 24. The process 64a represents a parameter-variable conversion illustrated in Equation (3). In other words, the output-number calculating section 51 performs a parameter-variable conversion so that the graph illustrated in FIG. 22 may be reversed with respect to the horizontal axis.

The output-number calculating section 51 performs the process 64b. The process 64b represents a process for calculating a standard output number Fk0 (number of times of continuously outputting an input bit without modification) and a standard residue number Fr0. The process 64b is the same as each of the processes 44a and 44b illustrated in FIG. 18.

The puncturing process section 52 performs the process 64c. The process 64c calculates an initial value offset of an initial value k0 by the parameter-variable conversion.

The puncturing process section 52 performs the process 64d. The process 64d performs initial settings of variables F, m, n, and k0. In the case of the repetition process, the leading bit of output bits becomes the leading bit of input bits. On the other hand, puncturing bits may begin from the middle of input bits. Then, the puncturing process section 52 assumes the case where remaining bits bit may begin from the middle of input bits. To insert a hypothetical remaining bit as an input/output bit index, n and m are defined as n=m=−1.

The puncturing process section 52 performs a process 64e. A process 64e represents that a puncturing process is repeated on all the bits of the input data. In addition, the process 64e represents that a standard residue number Fr0 is added to an error variable F and a standard output number Fk0 is added to a variable k0. Then, the process 64e represents that, when an error variable F is larger than an increment value $F_+$, the increment value $F_+$ is subtracted from the error variable F and 1 is subtracted from the variable k0. In addition, the process 64e represents that part of input bits corresponding to a value represented by the variable k0 is output as repeated value. Here, the process 64e is the same as the processes 44c to 44e of FIG. 18.

That is, the output-number calculating section 51 calculates the standard output number Fk0 where bits of the input data are sequentially output without modification when the number of times of puncturing of the input data is smaller than the number of remaining bits after puncturing. A parameter-variable conversion of an increment value $e_+$ and a decrement value $e_-$ to be used for determination of presence or absence is performed. Then, the puncturing process section 52 performs puncturing of bits of input data after continuously outputting input bits as much as a standard output number Fk0 or a subtraction standard-output number obtained by subtracting 1 from a standard output number Fk0. Therefore, in the puncturing process in FIG. 21, the amount of processing to be repeated is reduced compared with the puncturing process in FIG. 3.

Here, the process 64c calculates a variable k0i so that the number of while loop processes on a second stage between n=0 and the next input bit when an initial error variable is started from a variable of n=−1 may correspond to the number of times of repetition of the leading bit. On the other hand, the number of times of continuously outputting input bits is equal to or 1 smaller than the standard output number Fk0. Therefore, the puncturing process section 52 subtracts an offset from an initial value of the standard output number Fk0 in advance so that only the output number for n=m=−1 may become equal to the number of repetition of the leading bit. Furthermore, the puncturing process section 52 corrects the error variable F in the process 64d so that it will satisfy the condition of 0<e<$e_+$ by once performing a process for updating an error-variable.

Figure 25:
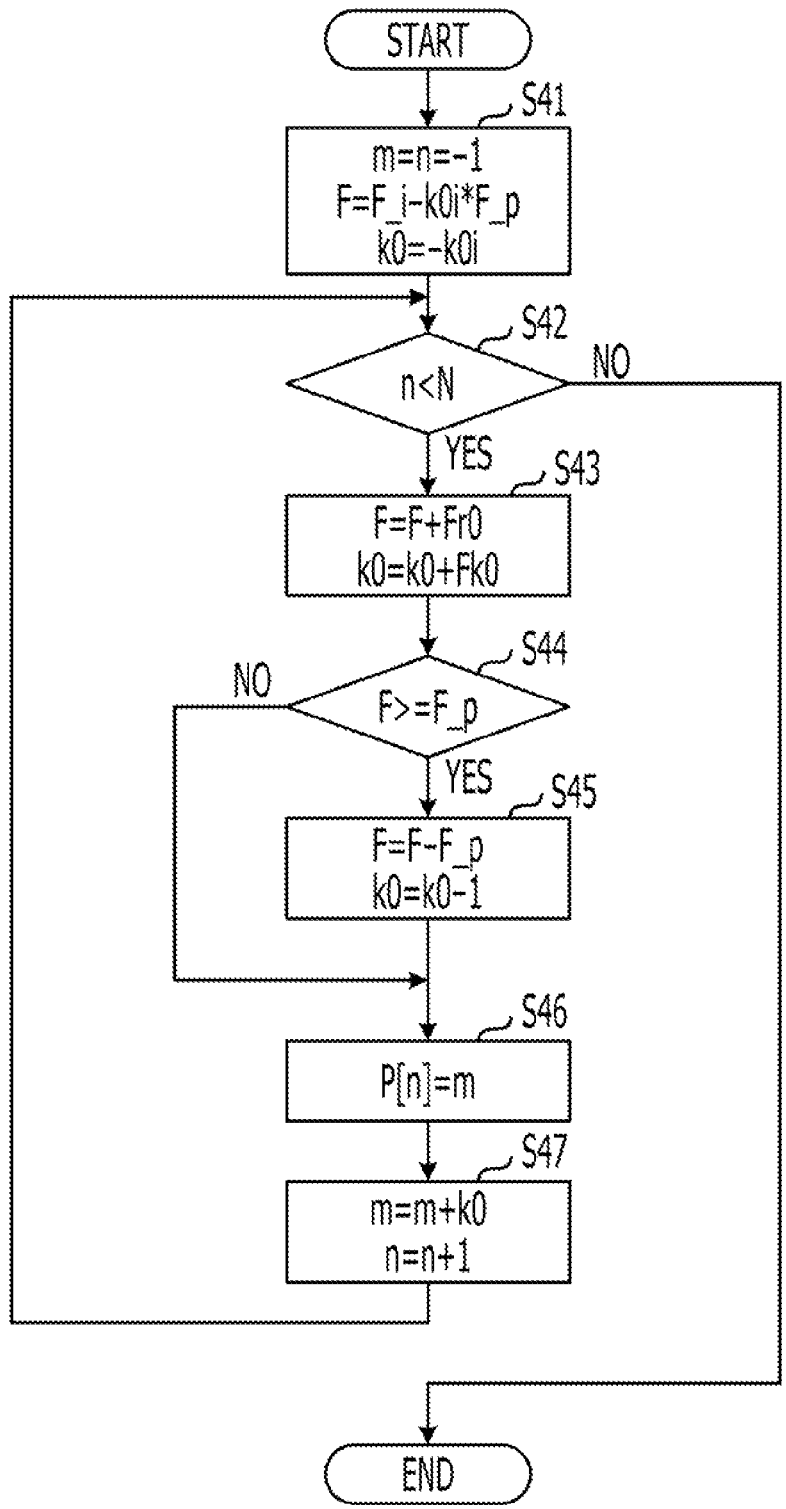
FIG. 25 is a flowchart illustrating an exemplary puncturing-pattern generation process.

FIG. 25 is a flowchart illustrating an exemplary puncturing-pattern generation process. As will be described below, the flow chart of FIG. 25 illustrates a process for obtaining a relationship between bit positions of input data and the number of times of repeatedly outputting bits located on the bit positions. Although not illustrated in the flow chart of FIG. 25, the output-number calculating section 51 assumes that the parameter-variable conversion illustrated by Equation (3) is performed. In addition, the output-number calculating section 51 assumes that standard output number Fk0 and standard residue number Fr0 are calculated.

[Step S41]

The puncturing process section 52 initializes variables m and n to −1. The variable m is a variable corresponding to a bit position of input data and the variable n is a variable corresponding to a bit position of output data. In addition, the puncturing process section 52 initializes an error variable F and a variable k0.

[Step S42]

The puncturing process section 52 determines whether the variable n is smaller than the number of times of puncturing N (maximal value of index). When the variable n is smaller than N, the puncturing process section 52 allows the process to proceed to Step S43. The puncturing process section 52 ends the process when the variable n is not smaller than N.

[Step S43]

The puncturing process section 52 adds the standard residue number Fr0 to the error variable F processed by parameter-variable conversion. In addition, the puncturing process section 52 adds the standard output number Fk0 to a variable k0.

[Step S44]

The puncturing process section 52 judges whether the error variable F is larger than an increment value F_p. The puncturing process section 52 allows the process to proceed to Step S45 when the error variable F is more than the increment value F_p. The puncturing process section 52 allows the process to proceed to Step S46 when the error variable F is smaller than the increment value F_p.

[Step S45]

The puncturing process section 52 subtracts an increment value F_p from the error variable F. In addition, the puncturing process section 52 subtracts 1 from the variable k0.

[Step S46]

The puncturing process section 52 stores the value of variable m in an arrangement P[n].

[Step S47]

The puncturing process section 52 adds the variable k0 to the variable m and adds 1 to the variable n, followed by allowing the process to proceed to Step S42.

As described above, the flowchart of FIG. 25 illustrates a process for determining a relationship between an index of each puncturing bit and a bit position of input data to be punctured. For example, puncturing bits are assigned with indexes 0, 1, 2, . . . , from the right side of the arrow 63c illustrated in FIG. 23. Then, the indexes of the respective puncturing bits are substituted for n of the arrangement P[n], determining bit positions of input data to be punctured.

For example, in the case of the example of FIG. 4, the bit positions of input data to be punctured are set to P[0]=0, P[1]=6, and P[2]=12, respectively. In other words, bit position of input data to be punctured may be found from the sequence P[n] obtained by the process illustrated in FIG. 25. In other words, the puncturing process section 52 is able to find a bit position to be punctured with reference to the standard output number. Thus, the input bits may be continuously output and then punctured.

Furthermore, the process in FIG. 25 may be performed such that the number of repeating the process N times with respect to the process in FIG. 6.

Thus, the output-number calculating section 51 calculates the number of outputs where bits of the input data are sequentially output when the number of remaining data after puncturing is smaller than the number of times of puncturing of the input data. Then, puncturing process section 52 performs a puncturing process of input data based on the calculated number of standard output. Therefore, the codec section 12 may sequentially specify positions of input bits to be punctured. Thus, the amount of processing may be reduced. For example, the amount of processing required for specifying puncturing bits is no more than twice the amount of processing required for a conventional determination process per bit of input bits. Thus, the amount of processing is reduced almost X/2M times.

Furthermore, the above second embodiment may be also applicable to a second rate matching of HS-DSCH.

Third Embodiment

Next, a third embodiment will be described in detail with reference to drawings. In the second embodiment, a reduction in amount of processing in the case where the number of times of puncturing of input data is smaller than the number of remaining bits after puncturing has been described above. In the third embodiment, in contrast, a reduction in amount of processing in the case where the number of times of puncturing of input data is larger than the number of remaining bits after puncturing will be described. Here, a communication system where a rate processing apparatus of the third embodiment is applied is the same as one illustrated in FIG. 2. Thus, the description thereof will be omitted.

Figure 26:
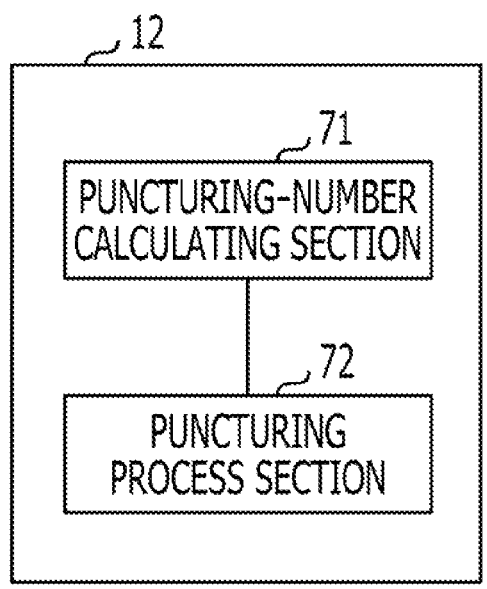
FIG. 26 is a diagram illustrating a block as a codec section according to a third embodiment.

FIG. 26 is a diagram illustrating a block as a codec section according to the third embodiment. As illustrated in FIG. 26, the codec section 12 includes a puncturing-number calculating section 71 and a puncturing process section 72. The codec section 12 performs a process for encoding data transfer channel HS-DSCH of HSPA, for example. The codec section 12 is allowed to realize, for example, functions of blocks in FIG. 26 when the CPU 12b executes programs stored in the memory 12a.

The puncturing-number calculating section 71 calculates a standard number of times of puncturing for continuously puncturing bits of input data is calculated when the number of times of puncturing of the input data is larger than a the number of remaining bits after puncturing.

Based on the standard number of times of puncturing calculated by the puncturing-number calculating section 71, the puncturing process section 72 performs puncturing of bits of input data continuously, and outputs the bits of the input data.

Figure 27:
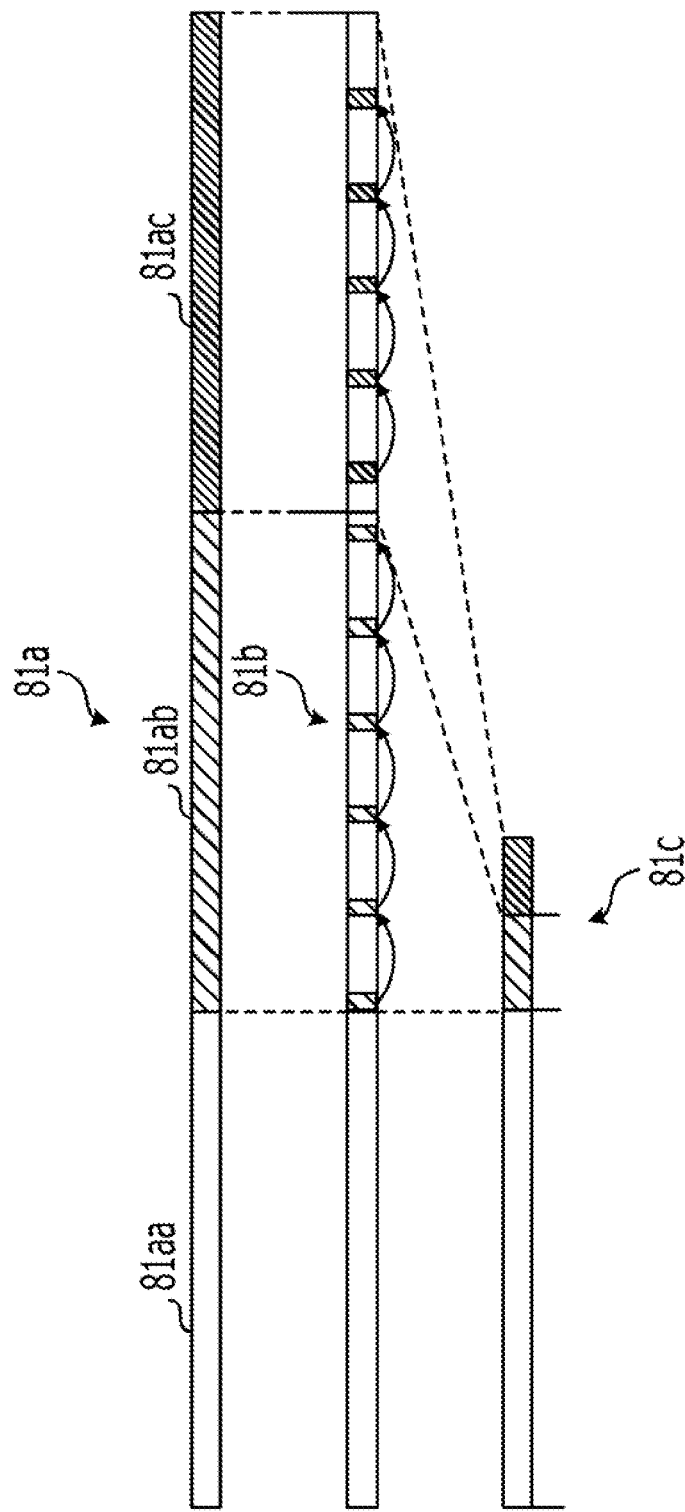
FIG. 27 is a diagram illustrating a puncturing process of the codec section.

FIG. 27 is a diagram illustrating a puncturing process of the codec section. FIG. 27 illustrates encoded bits 81a, which is turbo-encoded before the puncturing process. The encoded bits 81a include systematic bits 81aa, parity bits 81ab (parity series 1), and parity bits 81ac (parity series 2).

In a first rate matching of HSPA, for example, a puncturing process is applied when the number of bits after turbo encoding exceeds a H-ARQ soft buffer size. The output bits are restricted to those of the soft buffer size.

A puncturing process is independently applied to each of parity series 1 and 2 of encoded bits 81a. A difference between the puncturing processes on the parity series 1 and 2 is in parameter variables. In the following description, it will be described using the parity series 1 as an example.

The puncturing process punctures specified bits from bits $x_k$ (k=0, ..., $X_i$–1) of the parity bit 81ab. The blank areas in the encoded bits 81b illustrated in FIG. 27 represent the puncturing portion of parity bits 81ab and 81ac, respectively.

The encoded bits 81c illustrates a bit sequence after puncturing of encoded bits 81a. A bit sequence obtained as a result of puncturing the parity bits 81ab is set to $Y_k$ (k=0, ..., $Y_i$–1). Here, $Y_k$ and $Y_i$ are bit sizes before and after the puncturing process of the parity bits 81ab.

The puncturing in FIG. 27 is in a relationship of 2N<X (N: number of times of puncturing, X: number of bits in parity bits 81ab). In other words, the puncturing in FIG. 27 presupposes that the number of times of puncturing of input data (parity bits 81ab) is larger than the number of bits remaining after the puncturing.

Figure 28:
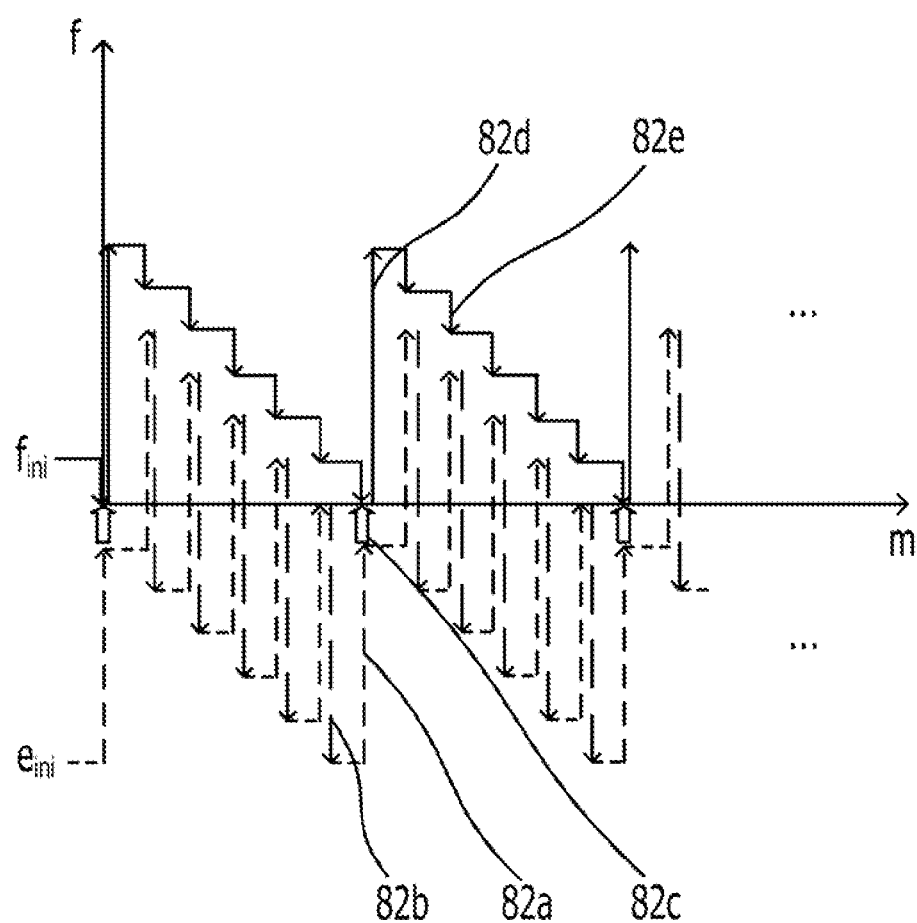
FIG. 28 is a diagram illustrating the puncturing operation illustrated in FIG. 27.

FIG. 28 is a diagram illustrating the puncturing operation illustrated in FIG. 27. Puncturing bit positions and the number of times of puncturing are determined based on parameter variables: an initial value $e_{ini}$, an increment value $e_+$, and a decrement value $e_-$. In FIG. 15, an up-pointing dashed arrow 82a represents the increment value $e_+$ and a down-pointing dashed arrow 82b represents a decrement value $e_-$.

A horizontal axis of a graph illustrated in FIG. 28 represents a bit position of input data to be punctured. For example, the bit position of parity bit 81ab illustrated in FIG. 27 is illustrated. A vertical axis of the graph illustrated in FIG. 27 represents a judgment value (error variable) e. When the error variable e becomes 0 (zero) or less, the corresponding input bit is punctured. An arrow 82c illustrated in FIG. 28 represents a bit position of input data to be punctured.

In the graph of FIG. 28, as illustrated in arrows 82d and 82e, parameter-variable conversion of increment value $e_+$ illustrated in dashed line arrows 82a and 82b and decrement value $e_-$ is carried out, when parameter-variable conversion of the initial value $e_{ini}$ is carried out to initial value $f_{ini}$, it will become being the same as that of the form illustrated in FIG. 22.

Therefore, when the number of times of puncturing of the input data is larger than the remaining bit after being puncture, parameter-variable conversion is performed such that a dashed line waveform is converted into a solid line waveform as illustrated FIG. 28. Thus, an amount of processing may be reduced by performing the parameter-variable conversion described in the second embodiment.

Equation (4) described below represents equations about parameter-variable conversion in the case where the number of times of puncturing of input data is larger than the number of remaining bits after puncturing.

$$f_+ = e_+$$

$$f_- = e_+ - e_-$$

$$Ep0 = e_+ - e_{ini}$$

$$kp0 = \lfloor Ep0/f_- \rfloor$$

$$f_{ini} = (kp0+1) \cdot f_- \qquad (4)$$

A first top Equation in Equation (4) represents that arrow 82d in FIG. 28 is calculated. A second top Equation in Equation (4) represents that arrow 82e in FIG. 28 is calculated. Each of third to fifth top Equations in Equation (4) represents an initial value $f_{ini}$ in FIG. 28 is calculated.

Figure 29:
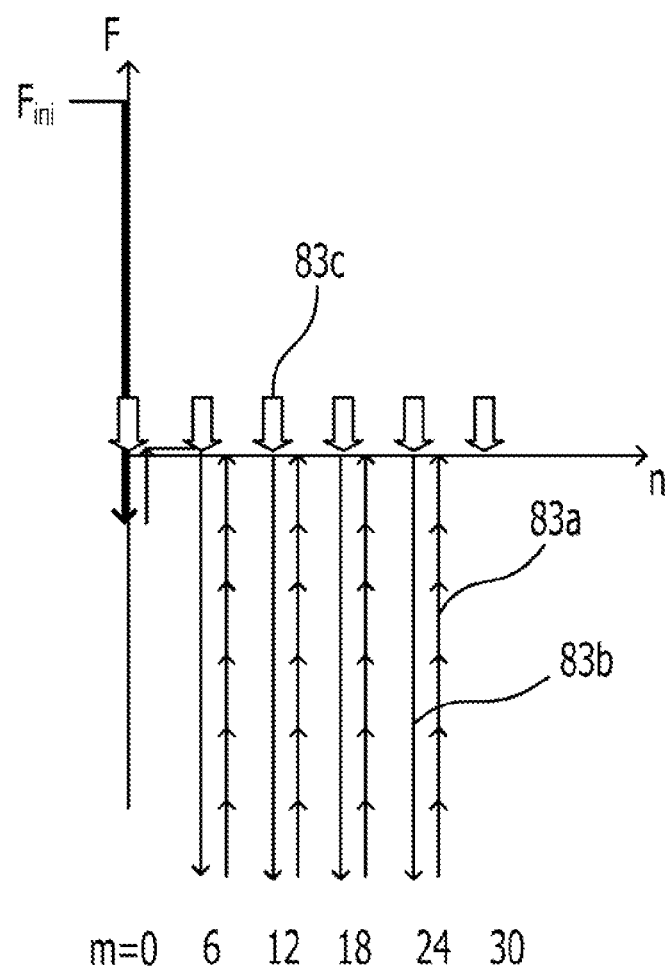
FIG. 29 is a diagram illustrating a puncturing operation where parameter-variable conversion is performed.

FIG. 29 is a diagram illustrating a puncturing operation where parameter-variable conversion is performed. A solid line waveform (Equation (4)) in FIG. 28 is subjected to parameter-variable conversion as represented by the next Equation (5) (i.e., parameter-variable conversion described in the second embodiment). Then, a horizontal axis is compressed and represented as one illustrated in FIG. 29.

$$F_+ = f_-$$

$$F_- = f_+$$

$$F_{ini} = -f_{ini} + f_+ \qquad (5)$$

The horizontal axis of FIG. 29 represents an index of a remaining bit in parity bits 81ab and the vertical axis thereof represents an error variable F obtained by parameter-variable conversion. An arrow 83a represents an increment value $F_+$ after the parameter-variable conversion. An arrow 83b represents a decrease value F– after the parameter-variable conversion. An arrow 83c represents an index of a remaining bit in the parity bits 81ab.

That is, in the case of a puncturing process of 2N<X, by the parameter-variable conversion represented by Equations (4) and (5), the puncturing-number calculating section 71 is able to convert into the same repetition standard form as one illustrated in FIG. 17.

FIG. 30 is a diagram illustrating an algorithm of a puncturing process. The puncturing-number calculating section 71 performs a process 84a illustrated in FIG. 30. The process 84a represents a parameter-variable conversion illustrated in Equation (4). That is, the puncturing-number calculating section 71 performs parameter-variable conversion so that the dashed line waveform illustrated in FIG. 28 may turn into a solid line waveform.

Both the puncturing-number calculating section 71 and the puncturing process section 72 perform a process 84b. The process 84b is the same as processes 64a to 64e illustrated in FIG. 24. Thus, the description thereof will be omitted. That is, when the number of times of puncturing calculating section 71 has number of times of puncturing of the input data larger than a the number of remaining bits after puncturing. Parameter-variable conversion of an increment value $e_+$ and a decrement value e, which are used for determining whether puncturing is present, are performed by Equations (4) and (5). A standard number Fk0 of times of continuously puncturing bits of input data is calculated. Based on the standard number of puncturing bits Fk0 or the number of times of puncturing from which 1 is subtracted, the puncturing process section 72 performs puncturing of bits of input data continuously, and outputs the bits of the input data. Therefore, in the puncturing process in FIG. 27, the amount of processing to be repeated is reduced compared with the puncturing process in FIG. 7.

Here, a flowchart is the same as one illustrated in FIG. 25. Thus, the description thereof will be omitted. However, in the third embodiment, the puncturing-number calculating section 71 performs parameter-variable conversion of Equation (4) before the operation process of the flow chart illustrated in FIG. 25. In the third embodiment, the puncturing process section 72 is able to find a bit position where an input bit is to be remained. Thus, the puncturing process section 72 may perform a puncturing process.

Thus, when the number of times of puncturing of the input data is larger than the number of remaining bits after puncturing, the puncturing-number calculating section 71 calculates a standard number of times of puncturing for continuously puncturing bits of input data. Then, puncturing process section 72 performs a puncturing process of input data based on the calculated standard number of times of puncturing. Therefore, the codec section 12 may sequentially specify positions of remaining bits. Thus, the amount of processing may be reduced. For example, the amount of processing required for specifying puncturing bits is no more than twice the amount of processing required for a conventional determination process per bit of input bits. Thus, the amount of processing is reduced almost X/2M times.

Furthermore, the above third embodiment may be also applicable to a second rate matching of HS-DSCH.

Fourth Embodiment

A fourth embodiment will be described with reference to the attached drawings. In the fourth embodiment, a reduction in amount of processing in the case where the number of times of repetition of input data is smaller than the number of remaining bits after the repetition.

Figure 31:
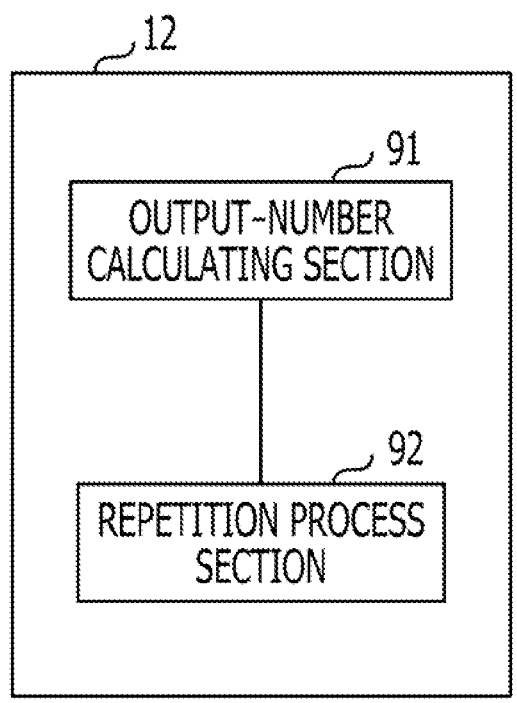
FIG. 31 is a diagram illustrating a block as a codec section according to a fourth embodiment.

FIG. 31 is a diagram illustrating a block as a codec section according to a fourth embodiment. As illustrated in FIG. 31, the codec section 12 includes an output-number calculating section 91 and a repetition process section 92. The codec section 12 performs a process for encoding data transfer channel HS-DSCH of HSPA, for example. The codec section 12 is allowed to realize, for example, functions of blocks in FIG. 31 when the CPU 12b executes programs stored in the memory 12a.

In the case where the number of times of repetition of input data is smaller than the number of output bits after the repetition. The output-number calculating section 91 calculates a standard output number which continuously outputs bits of input data.

Based on the standard output number calculated by the output-number calculating section 91, the repetition process section 92 outputs bits of input data one by one continuously as it is, and performs repetition.

Figure 32:
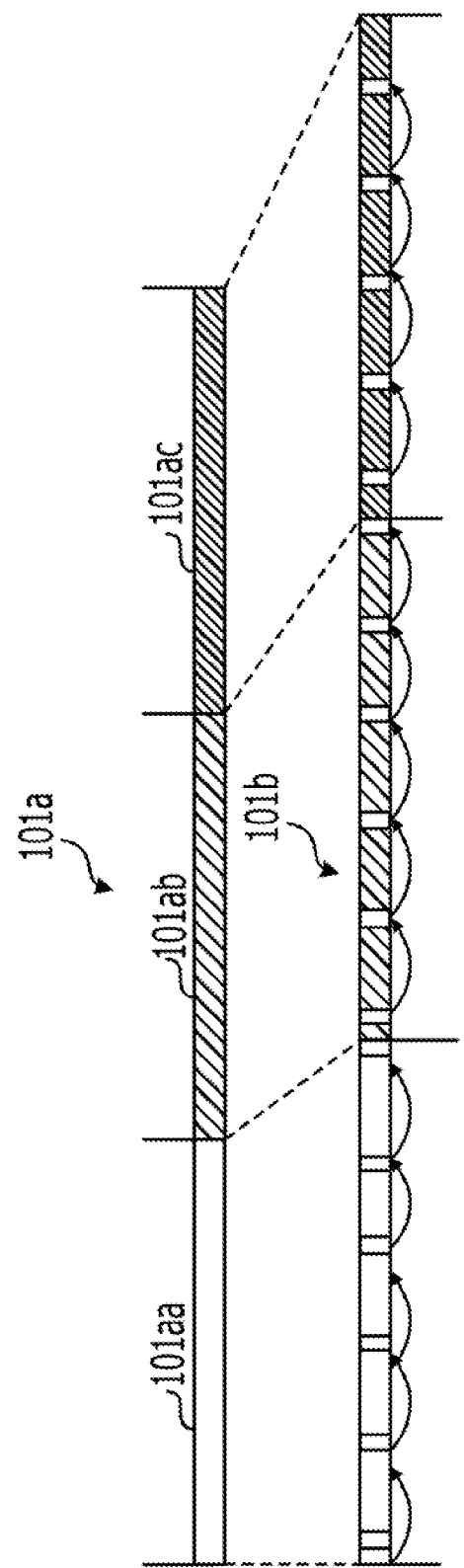
FIG. 32 is a diagram illustrating a repetition process of the codec section.

FIG. 32 is a diagram illustrating a repetition process of the codec section. In FIG. 32, encoded bits 101a, which are turbo-encoded before repetition of second rate matching, is illustrated. The encoded bits 101a include systematic bits 101aa, parity bits 101ab (parity series 1), and parity bits 101ac (parity series 2).

In a second rate matching of HSPA, for example, a repetition process is applied when the number of bits after turbo encoding does not exceed an H-ARQ soft buffer size. In the second rate matching of HSPA, a repetition process is applied to each of the systematic bits 101aa, the parity bits 101ab, and the parity bits 101ac.

A repetition process repeatedly outputs any bit of the encoded bits 101a. Blank areas of encoded bits 101b illustrated in FIG. 32 represent repeated portions of the encoded bits 101a.

In the repetition illustrated in FIG. 32, there is a relation represented by 2N<Y (Y: number of output bits, and N: number of repetition bits). That is, the repetition of FIG. 32 presupposes that the number of times of repetition of input data is smaller than the number of bits of input data.

Figure 33:
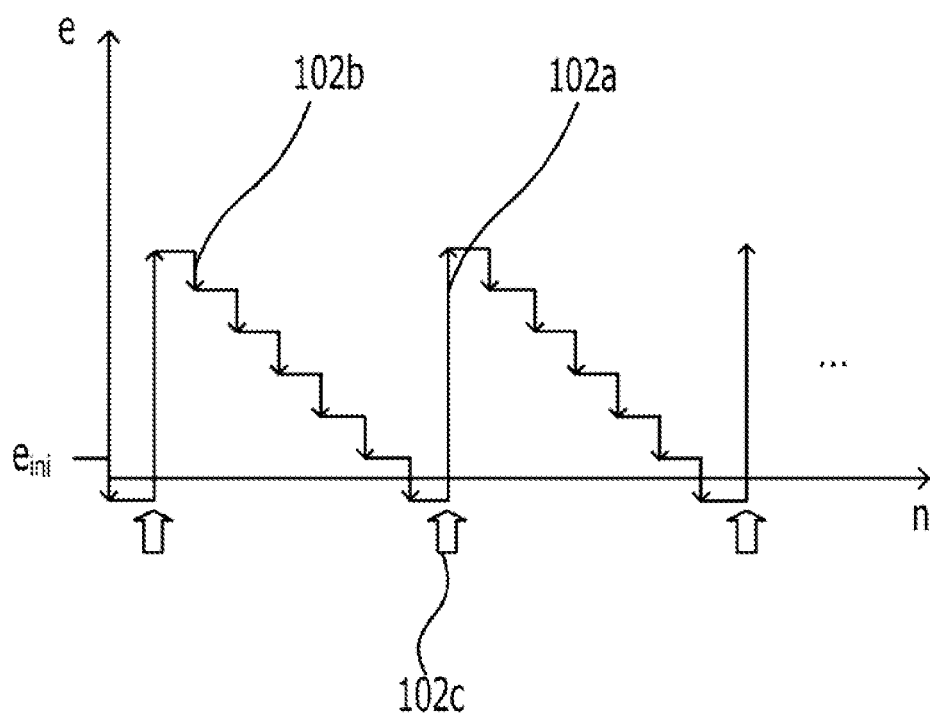
FIG. 33 is a diagram illustrating the repetition operation of FIG. 32.

FIG. 33 is a diagram illustrating the repetition operation of FIG. 32. Repetition positions and the number of repetition bits are determined based on parameter variables: an initial value $e_{ini}$, an increment value $e_+$, and a decrement value $e_-$. In FIG. 33, an up-pointing arrow 103a represents the increment value $e_+$ and a down-pointing arrow 102b represents a decrement value $e_-$.

A horizontal axis of a graph illustrated in FIG. 33 represents a bit position of input data to be subjected to the repetition process. For example, the horizontal axis represents the position of a bit in the encoded bits 101a illustrated in FIG. 32. A vertical axis of the graph illustrated in FIG. 33 represents a judgment value (error variable) e. When the error variable e becomes 0 (zero) or less, the corresponding input bit is repeated. An arrow 102c illustrated in FIG. 33 represents a bit position of input data to be subjected to repetition.

When the graph in FIG. 33 is reversed with respect to the horizontal axis, it becomes the same form as the repetition standard form illustrated in FIG. 15. Therefore, when the number of times of repetition of input data is smaller than the number of bits of input data. Thus, an amount of processing may be reduced by performing the parameter-variable conversion represented by the following Equation (6).

$$F_+ = e_-$$

$$F_- = e_+$$

$$F_{ini} = -e_{ini} + e_+ \quad (6)$$

FIG. 33 is similar to FIG. 22, and Equation (6) is similar to Equation (3).

Figure 34:
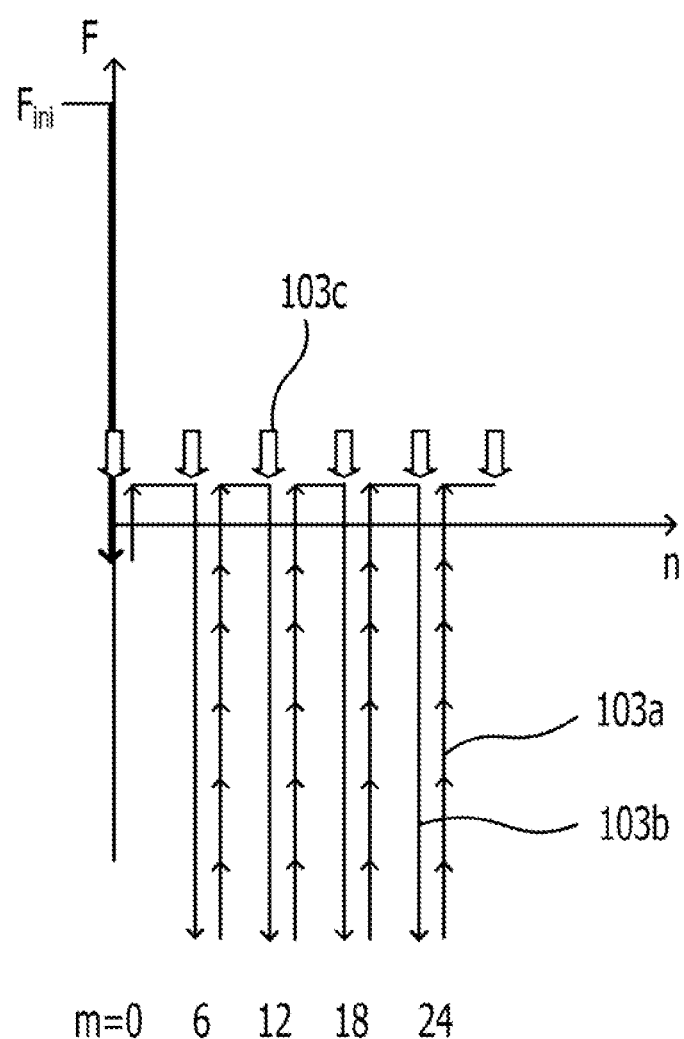
FIG. 34 is a diagram illustrating a repetition operation where parameter-variable conversion is performed.

FIG. 34 is a diagram illustrating a repetition operation where parameter-variable conversion is performed. As represented by Equation (6), parameter-variable conversion is performed on parameter variables of initial value $e_{ini}$, increment value $e_+$, and decrement value $e_-$ which are illustrated in FIG. 33. Then, a horizontal axis is compressed and represented as one illustrated in FIG. 29.

A horizontal axis of FIG. 29 represents, for example, bits to be subjected to repetition in encoded bits 101a illustrated in FIG. 32 and a vertical axis thereof represents an error variable F obtained by parameter-variable conversion. An arrow 103a represents an increment value $F_+$ after the parameter-variable conversion. An arrow 103b represents a decrease value $F_-$ after the parameter-variable conversion. An arrow 103c represents an input bit to be subjected to repetition.

That is, in the case of a repetition process of 2N<Y, output-number calculating section 91 is, by the parameter-variable conversion represented by Equation (6), the puncturing-number calculating section 71 is able to convert into the same repetition standard form as one illustrated in FIG. 17.

FIG. 35 is a diagram illustrating an exemplary algorithm of a repetition process. A process 104 illustrated in FIG. 35 is similar to the process 64a to 64e illustrated in FIG. 24. Thus, the description thereof will be omitted.

Both the output-number calculating section 91 and the repetition process section 92 perform a process 104. When the number of times of repetition of input data is smaller than the number of bits of input data, the output-number calculating section 91 performs parameter-variable conversion of an increment value $e_+$ and a decrement value $e_-$, which are used for determining whether repetition is present, by Equation (6). A standard output number Fk0 is calculated. Here, the standard output number Fk0 is provided for sequentially outputs bits of input data in order without modification (i.e., output without subjecting the input bits to repetition). Then, the repetition process section 92 performs repetition of bits of input data after continuously outputting input bits as much as a standard output number Fk0 or a subtraction standard-output number obtained by subtracting 1 from a standard output number Fk0. Therefore, in the repetition process in FIG. 32, the amount of processing to be repeated is reduced compared with the repetition process in FIG. 9.

In the case of the repetition process, the leading bit of output bits becomes the leading bit of input bits. In contrast, when the parameter-variable conversion illustrated in Equation (6) is performed, the leading bit of output bits may not become the leading bit of input bits in some cases. Then, in a manner similar to the second embodiment, the repetition process sections 92 sets n and m as n=m=−1 to insert a hypothetical remaining bit as an input/output bit index. Then, the repetition process section 92 corrects the standard output number Fk0 and the error variable F in a manner similar to the second embodiment.

A flow chart becomes the same as that of FIG. 25, and the description is omitted. However, in the fourth embodiment, the output-number calculating section 91 performs parameter-variable conversion of Equation (6) before the operation process of the flow chart illustrated in FIG. 25. Furthermore, in the fourth embodiment, the repetition process section 92 is able to find a bit position to be subjected to repetition and then perform a repetition process.

Thus, the output-number calculating section 91 calculates the number of outputs where bits of the input data are sequentially output when the number of remaining data after repetition is smaller than the number of times of repetition of input data. Then, the repetition process section 92 performs the repetition process on input data based on the calculated standard output number. Therefore, the codec section 12 may sequentially specify positions of input bits to be subjected to repetition. Thus, the amount of processing may be reduced. For example, the amount of processing required for specifying bits to be subjected to repetition is no more than twice the amount of processing required for a conventional determination process per bit of input bits. Thus, the amount of processing is reduced almost Y/2N times.

Furthermore, the above fourth embodiment may be also applicable to a second rate matching of a dedicated channel (DCH).

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments have been described in detail, it should be understood that the various changes, substitutions, and alterations could be made hereto without departing from the spirit and scope of the invention.

What is claimed is:

1. A rate adjustment apparatus, comprising:
a memory; and
a processor coupled to the memory and configured
to determine a number of bits between each pair of bits chosen to be punctured when a number of bits chosen to be punctured is smaller than a number of remaining bits that are not to be punctured; and
to output the remaining bits that are not to be punctured while puncturing the bits chosen to be punctured based on the determined number.

2. The rate adjustment apparatus according to claim 1, wherein
the processor is configured to determine the number of bits chosen to be punctured based on an increment value and a decrement value.

3. The rate adjustment apparatus according to claim 2, wherein
the processor is configured to output sequentially the determined number of bits or sequentially outputs another number of bits that is determined by decrementing the determined number by one.

4. The rate adjustment apparatus according to claim 2, wherein the processor is configured to determine the number of bits by dividing the increment value by the decrement value.

5. A rate adjustment apparatus, comprising:
a memory;
a processor coupled to the memory, the processor being configured to:
determine a number of bits to puncture in input data when a number of bits chosen to be punctured in the input data is larger than a number of remaining bits that are not to be punctured; and
output the remaining bits that are not to be punctured while puncturing the bits chosen to be punctured based on the number of bits to puncture.

6. The rate adjustment apparatus according to claim 5, wherein
the processor is further configured to determine the number of bits to puncture based on an increment value and a decrement value used to determine whether puncturing is present with respect to each bit of the input data.

7. The rate adjustment apparatus according to claim 6, wherein
the processor is further configured to output the number of bits to puncture or output a number of subtraction outputs obtained by subtracting 1 from the number of bits to puncture in order to output bits of the input data.

8. A rate adjustment apparatus, comprising:
a memory; and
a processor coupled to the memory, the processor being configured to:
determine a number of bits that are sequentially output between each pair of bits chosen to be repeated in input data when a number of the bits in the input data is larger than a sum of a number of bits to be repeated; and
output the input data while duplicating the bits chosen to be repeated.

9. The rate adjustment apparatus according to claim 8, wherein
the processor is further configured to determine the number of bits based on an increment value and a decrement value used to determine whether repetition is present with respect to each bit of the input data.

10. The rate adjustment apparatus according to claim 9, wherein
the processor is further configured to output the number of bits or outputs a number of subtraction outputs obtained by subtracting 1 from the number of bits to subject bits of the input data to repetition.

11. A rate adjustment method of a rate adjustment apparatus, comprising:
when a number of bits previously punctured in input data is smaller than a number of remaining bits after puncturing,
calculating a number of bits of input data that are output; and
outputting the input data while puncturing additional bits of the input data based on the calculated number of outputs.

12. The rate adjustment method according to claim 11, wherein
when calculating the number of outputs, the number of outputs is calculated based on an increment value and a decrement value used for determining whether puncturing is present with respect to each bit of the input data.

13. The rate adjustment method according to claim 12, wherein
when puncturing, the number of outputs calculated from the bits of the input data or a number of subtraction outputs obtained by subtracting 1 from the calculated number of outputs are output to puncture bits of the input data.

14. A rate adjustment method of a rate adjustment apparatus, comprising:
when a number of bits punctured in input data is larger than a number of remaining bits after puncturing,
calculating a number of additional bits to puncture in the input data; and
puncturing the additional bits while outputting bits of the input data.

15. The rate adjustment method according to claim 14, wherein
when calculating the number of additional bits, the number of bits punctured in the input data is calculated based on an increment value and a decrement value used for determining whether puncturing is present with respect to each bit of the input data.

16. The rate adjustment method according to claim 15, wherein
when puncturing the additional bits, the number of additional bits or a number of subtraction outputs obtained by subtracting 1 from the number of additional bits is punctured to output bits of the input data.

17. A rate adjustment apparatus, comprising:
a memory; and
a processor coupled to the memory and configured
to determine a number of repetition in repetition processing based on a predetermined standard number of repetitions and a standard residue number associated with each bit in input data when a number of the bits in the input data is smaller than a sum of the number of repetitions; and to output bits after the repetition processing based on the determined number of repetition.

18. The rate adjustment apparatus according to claim 17, wherein when the number of repetition is calculated, the number of repetition is calculated based on an increment value and a decrement value used for determining whether repetition is present with respect to each bit of the input data.

19. The rate adjustment apparatus according to claim 17, wherein when the repetition process is performed, the number of repetition calculated from the bits of the input data or a number of subtraction outputs obtained by subtracting 1 from the number of repetition is output to subject bits of the input data to repetition.

\* \* \* \* \*